(12) United States Patent
Imagawa

(10) Patent No.: US 11,094,787 B2
(45) Date of Patent: Aug. 17, 2021

(54) METHOD OF MANUFACTURING SEMICONDUCTOR DEVICE AND SEMICONDUCTOR DEVICE

(71) Applicant: FUJI ELECTRIC CO., LTD., Kanagawa (JP)

(72) Inventor: Tetsutaro Imagawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/882,534

(22) Filed: May 24, 2020

(65) Prior Publication Data

US 2020/0287005 A1     Sep. 10, 2020

Related U.S. Application Data

(63) Continuation of application No. PCT/JP2019/018048, filed on Apr. 26, 2019.

(30) Foreign Application Priority Data

Jun. 22, 2018   (JP) .............................. JP2018-118793

(51) Int. Cl.
*H01L 29/06*     (2006.01)
*H01L 29/10*     (2006.01)
(Continued)

(52) U.S. Cl.
CPC ...... *H01L 29/41708* (2013.01); *H01L 21/266* (2013.01); *H01L 21/26513* (2013.01);
(Continued)

(58) Field of Classification Search
CPC ......... H01L 29/41708; H01L 21/26513; H01L 21/266; H01L 21/324; H01L 21/765;
(Continued)

(56) References Cited

U.S. PATENT DOCUMENTS

2013/0082302 A1    4/2013  Nakamura
2013/0234200 A1    9/2013  Fujii
(Continued)

FOREIGN PATENT DOCUMENTS

JP      2013084904 A     5/2013
JP      2013187440 A     9/2013
(Continued)

OTHER PUBLICATIONS

International Search Report and (ISA/237) Written Opinion of the International Search Authority for International Patent Application No. PCT/JP2019/018048, mailed by the Japan Patent Office dated Jul. 30, 2019.

*Primary Examiner* — David Vu

(57) ABSTRACT

There is provided a method of manufacturing a semiconductor device including: forming a cell having a plurality of trench portions, a contact region, being formed by implanting a dopant of a second conductivity type by a first depth and a first implantation amount, and an emitter region, the cell having a length, which is smaller than or equal to a width between the trench portions, the emitter region, having a length, which is greater than a length of the contact region; forming a contact hole, having an opening width which is smaller than the length of the contact region; and forming a plug region by implanting the dopant of the second conductivity type by a second depth, being shallower than the first depth, and a second implantation amount, being greater than or equal to the first implantation amount, in the depth direction of the semiconductor substrate.

12 Claims, 24 Drawing Sheets

(51) Int. Cl.
*H01L 29/739* (2006.01)
*H01L 29/417* (2006.01)
*H01L 21/265* (2006.01)
*H01L 21/266* (2006.01)
*H01L 21/324* (2006.01)
*H01L 21/765* (2006.01)
*H01L 27/06* (2006.01)
*H01L 29/40* (2006.01)
*H01L 29/66* (2006.01)
*H01L 29/861* (2006.01)

(52) U.S. Cl.
CPC .......... *H01L 21/324* (2013.01); *H01L 21/765* (2013.01); *H01L 27/0664* (2013.01); *H01L 29/0696* (2013.01); *H01L 29/1095* (2013.01); *H01L 29/407* (2013.01); *H01L 29/66136* (2013.01); *H01L 29/66348* (2013.01); *H01L 29/7397* (2013.01); *H01L 29/8613* (2013.01)

(58) Field of Classification Search
CPC ............. H01L 27/0664; H01L 29/0696; H01L 29/1095; H01L 29/407; H01L 29/66136; H01L 29/66348; H01L 29/7397; H01L 29/8613; H01L 29/417; H01L 29/0834; H01L 29/4238; H01L 29/78
See application file for complete search history.

(56) References Cited

U.S. PATENT DOCUMENTS

| | | |
|---|---|---|
| 2015/0380536 A1 | 12/2015 | Kimura |
| 2016/0035868 A1 | 2/2016 | Naito |
| 2016/0211361 A1 | 7/2016 | Nishimura |
| 2017/0263740 A1 | 9/2017 | Onozawa |
| 2019/0097030 A1* | 3/2019 | Miyata ................ H01L 29/0696 |
| 2019/0148532 A1 | 5/2019 | Naito |

FOREIGN PATENT DOCUMENTS

| | | |
|---|---|---|
| JP | 2016033993 A | 3/2016 |
| JP | 2016134387 A | 7/2016 |
| JP | 2017168829 A | 9/2017 |
| WO | 2014125583 A1 | 8/2014 |
| WO | 2018056233 A1 | 3/2018 |
| WO | 2018105729 A1 | 6/2018 |

* cited by examiner

METHOD OF MANUFACTURING SEMICONDUCTOR DEVICE AND SEMICONDUCTOR DEVICE

The contents of the following Japanese patent applications are incorporated herein by reference:
NO. 2018-118793 filed in JP on Jun. 22, 2018, and
NO. PCT/JP2019/018048 filed on Apr. 26, 2019.

BACKGROUND

1. Technical Field

The present invention relates to a method of manufacturing a semiconductor device and a semiconductor device.

2. Related Art

In the related art, semiconductor devices such as an insulated gate bipolar transistor (IGBT) are known (for example, see Patent Documents 1, 2, and 3). In such a semiconductor device, miniaturization and sophistication are required.

Patent Document 1: Japanese Unexamined Patent Application Publication No. 2017-168829
Patent Document 2: Japanese Unexamined Patent Application Publication No. 2016-33993
Patent Document 3: Japanese Unexamined Patent Application Publication No. 2013-187440

Problem to be Solved by the Invention

Therefore, in a semiconductor device, it is preferable to prevent a reduction in an RBSOA (Reverse Bias Safe Operating Area) tolerance while achieving miniaturization and sophistication.

SUMMARY

A first aspect of the present invention provides a method of manufacturing a semiconductor device. A cell may be formed by a plurality of trench portions, a contact region of a second conductivity type, and an emitter region of a first conductivity type. Each of the plurality of trench portions may be provided, from an upper surface of a semiconductor substrate to an inside of the semiconductor substrate, to extend in a predetermined extension direction on the upper surface of the semiconductor substrate. The contact region of the second conductivity type may be formed, in a depth direction of the semiconductor substrate between adjacent two of the trench portions, by implanting a dopant of the second conductivity type by a first depth and a first implantation amount. The emitter region of the first conductivity type may be disposed, in alignment with the contact region in the extension direction between the adjacent two of the trench portions, to be exposed on the upper surface of the semiconductor substrate. The cell may have a length, in the extension direction, which is smaller than or equal to a width between the adjacent two of the trench portions, and the emitter region in the cell may have a length, in the extension direction, which is greater than a length of the contact region. A contact hole may be formed above the cell, the contact hole having an opening width, between the trench portions, which is smaller than the length of the contact region in the extension direction. In the method of manufacturing of a semiconductor device, a plug region of the second conductivity type may be formed by implanting the dopant of the second conductivity type by a second depth and a second implantation amount, in the depth direction of the semiconductor substrate, the second depth being shallower than the first depth, the second implantation amount being greater than or equal to the first implantation amount.

The cell may be formed such that the length of the cell is 3.2 μm or less in the extension direction.

The contact hole may be formed such that the opening width of the contact hole between the trench portions is 1.0 μm or less.

The contact hole and the trench portion may be formed such that the opening width of the contact hole between the trench portions is smaller than a width of each of the trench portions.

The contact hole may be formed such that the opening width of the contact hole between the trench portions is greater than the second depth.

The contact hole and the plug region may be formed such that the opening width of the contact hole between the trench portions is smaller than a width of the plug region between the trench portions.

The plug region and the contact region may be formed such that a peak position of a doping concentration of the plug region in the depth direction of the semiconductor substrate is shallower than half a depth from the upper surface of the semiconductor substrate to a peak position of a doping concentration of the contact region.

The plug region may be formed by causing a mask to overlap an end portion of the contact region in the extension direction, and implanting the dopant.

The contact hole may be formed such that a length at which the mask overlaps the end portion of the contact region is smaller than the opening width of the contact hole between the trench portions.

The contact region may be annealed at a first temperature for a first period of time; and
The plug region may be annealed at a second temperature for a second period of time, the second temperature being lower than the first temperature, the second period of time being shorter than the first period of time.

A diode portion including the plug region may be further formed on the semiconductor substrate, the plug region being formed by implanting the dopant of the second conductivity type by the second depth and the second implantation amount rather than by implanting the dopant of the second conductivity type by the first depth and the first implantation amount.

A sense semiconductor element portion may be formed on the semiconductor substrate by forming a main semiconductor element portion including the cell, and forming a current detection cell in the same step as the cell.

A second aspect of the present invention provides a semiconductor device. The semiconductor device may include a semiconductor substrate, a trench portion, a base region of a second conductivity type, a contact region of the second conductivity type, an emitter region, a plug region of the second conductivity type, and a contact hole. The trench portion may be provided from an upper surface of the semiconductor substrate to an inside of the semiconductor substrate. The trench portion may be provided to extend in a predetermined extension direction on the upper surface of the semiconductor substrate. The base region of the second conductivity type may be provided to be shallower than the trench portion inside the semiconductor substrate. The contact region of the second conductivity type may be provided above the base region inside the semiconductor substrate. The emitter region may be provided in alignment with the contact region above the base region inside the semiconductor substrate. The plug region of the second conductivity type may be provided to be shallower than a depth of the contact region inside the semiconductor substrate. The plug region of the second conductivity type may have a higher doping concentration than that of the contact region. The contact hole may be provided above the contact region and the emitter region. An opening width of the contact hole between trench portions may be smaller than a length of the contact region in the extension direction. A cell formed by the contact region and the emitter region may have a length, in the extension direction, which is smaller than or equal to a width between adjacent two of the trench portions, and the emitter region may have a length, in the extension direction, which is greater than the length of the contact region. A first integrated concentration obtained by integrating the doping concentration of the plug region in a depth direction of the semiconductor substrate may be higher than or equal to a second integrated concentration obtained by integrating the doping concentration of the contact region in the depth direction of the semiconductor substrate.

DESCRIPTION OF EXEMPLARY EMBODIMENTS

Figure 1:
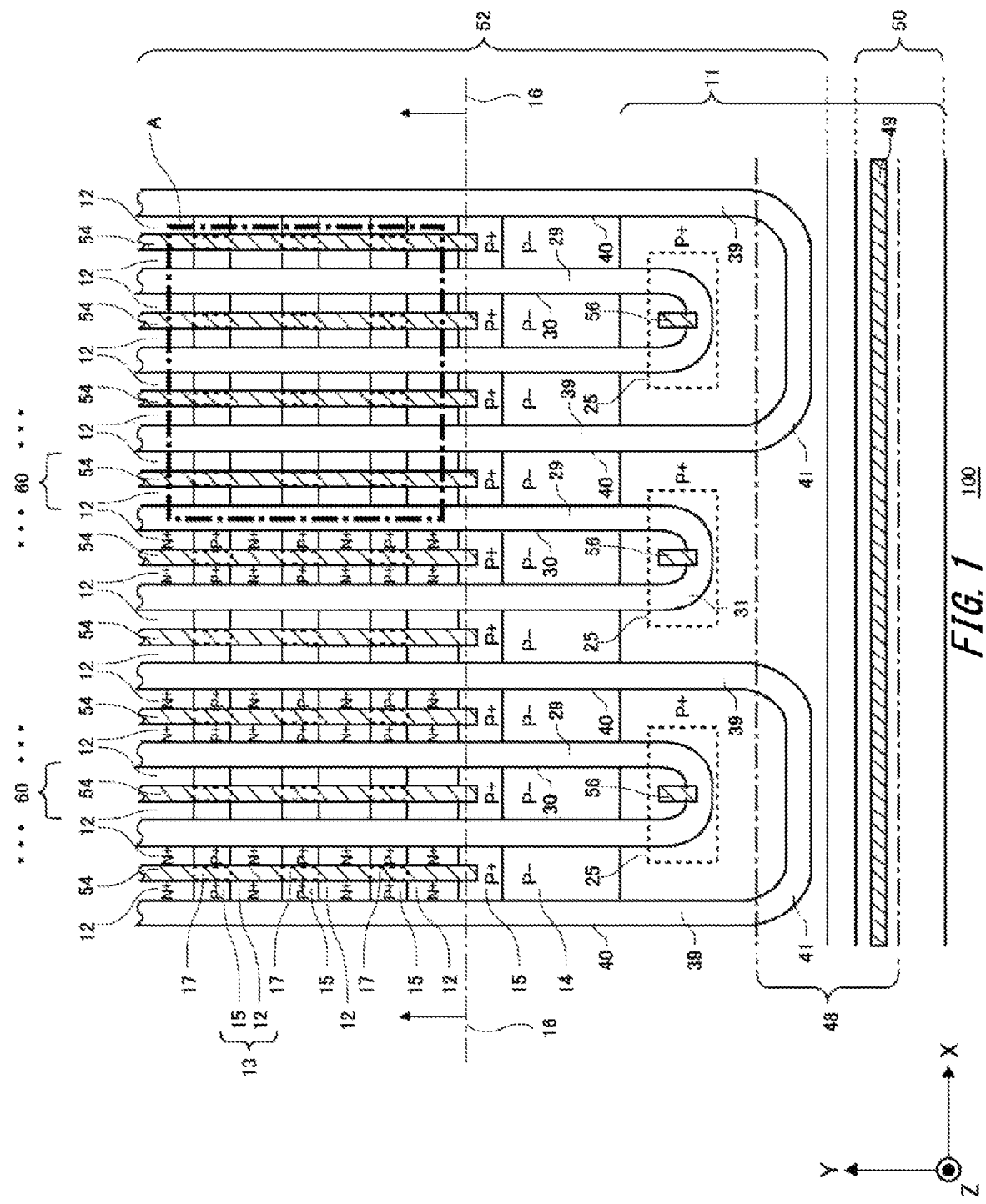
FIG. 1 is a view partially showing an example of an upper surface of a semiconductor device 100 according to an embodiment of the invention.

Hereinafter, the invention will be described through embodiments of the invention, but the following embodiments do not limit the invention according to the claims. Further, not all the combinations of features described in the embodiments are essential for means for solving the problem in the invention.

In the specification, one side in a direction parallel to a depth direction of a semiconductor substrate is referred to as an "upper" side, and the other side is referred to as a "lower" side. One surface of two principal surfaces of a substrate, a layer, or another member is referred to as an upper surface, and the other surface is referred to as a lower surface. "Upper" and "lower" directions are not limited to a direction of gravity, or an attachment direction of a semiconductor device to a substrate or the like when the semiconductor device is mounted.

In the specification, technical matters may be described using orthogonal coordinate axes of an X axis, a Y axis, and a Z axis. In the specification, a plane parallel to the upper surface of the semiconductor substrate is defined as an XY plane, and a depth direction of the semiconductor substrate is defined as a Z axis.

Each Example shows an example in which a first conductivity type is an N type, and a second conductivity type is a P type; however, the first conductivity type may be the P type and the second conductivity type may be the N type. In this case, polarities of conductivity types of a substrate, a layer, a region, and the like in each Example are opposite. Further, in the specification, a description of a P+ type (or an N+ type) means a higher doping concentration than that of the P type (or the N type), and a description of a P− type (or an N− type) means a lower doping concentration than that of the P type (or the N type).

In the specification, a doping concentration indicates a concentration of a dopant serving as a donor or an acceptor. Therefore, the unit is, /cm$^3$. In the specification, a concentration difference between the donor and the acceptor (that is, a net doping concentration) may be defined as the doping concentration. In this case, the doping concentration can be measured by an SR method (a Spreading Resistance method). Further, a chemical concentration of the donor and the acceptor may be defined as the doping concentration. In this case, the doping concentration can be measured by SIMS (secondary ion mass spectrometry) method. Unless otherwise limited, any of the above may be used as the doping concentration. Unless otherwise limited, a peak value of a doping concentration distribution in a doping region may be defined as a doping concentration in the doping region.

Further, in the specification, a dose means the number of ions per unit area to be implanted into a wafer when an ion implantation is performed. Therefore, the unit is, /cm$^2$. Note that the dose of a semiconductor region can be defined as an integrated concentration obtained by integrating the doping concentration over the depth direction of the semiconductor region. The unit of the integrated concentration is, /cm². Therefore, the dose and the integrated concentration may be treated as the same. The integrated concentration may be an integrated value up to a half-value width, and when a spectrum of the other semiconductor region overlaps, the integrated concentration may be derived excluding an influence of the other semiconductor region.

FIG. 1 is a view partially showing an example of an upper surface of a semiconductor device 100 according to an embodiment of the invention. The semiconductor device 100 of this example is a semiconductor chip having a transistor such as an insulated gate bipolar transistor (IGBT). FIG. 1 shows an upper surface of the chip around an end portion of the chip, and other regions are omitted.

FIG. 1 shows an active region of a semiconductor substrate in the semiconductor device 100. The active region is a region where a current flows between the upper surface and a lower surface of the semiconductor substrate when the semiconductor device 100 is controlled to be in an ON state. For example, the active region is a region surrounded by a gate metal layer 50 shown in FIG. 1.

The semiconductor device 100 may have an edge termination structure portion surrounding the active region. For example, the edge termination structure portion is provided on an end portion side of the semiconductor substrate further than the gate metal layer 50 shown in FIG. 1. The edge termination structure portion relaxes an electric field concentration on the upper surface side of the semiconductor substrate. The edge termination structure portion has, for example, a structure of a guard ring, a field plate, a RESURF, or a combination of these.

The semiconductor device 100 of this example includes a gate trench portion 40, a dummy trench portion 30, a well region 11, an emitter region 12, and a contact region 15 which are provided inside the semiconductor substrate on the upper surface side. Each of the gate trench portion 40 and the dummy trench portion 30 is an example of the trench portion. Further, the semiconductor device 100 of this example includes an emitter electrode 52 and the gate metal layer 50 which are provided above the upper surface of the semiconductor substrate. The emitter electrode 52 and the gate metal layer 50 are provided separately from each other.

Between the emitter electrode 52 and the gate metal layer 50, and the upper surface of the semiconductor substrate, an interlayer dielectric film is provided, but is omitted in FIG. 1. In the interlayer dielectric film of this example, a contact hole 56, a contact hole 49, and a contact hole 54 are provided to pass through the interlayer dielectric film. In FIG. 1, each contact hole is hatched with diagonal lines.

The emitter electrode 52 is provided above the gate trench portion 40, the dummy trench portion 30, the well region 11, the emitter region 12, and the contact region 15. The emitter electrode 52 is in contact with emitter region 12 on the upper surface of the semiconductor substrate, through the contact hole 54. Further, the emitter electrode 52 is connected to a dummy conductive portion in the dummy trench portion 30, through the contact hole 56. Between the emitter electrode 52 and the dummy conductive portion, a connection portion 25 formed of a conductive material such as polysilicon doped with impurities may be provided. The connection portion 25 is provided on the upper surface of the semiconductor substrate. An insulation film such as a thermal oxide film is provided between the connection portion 25 and the semiconductor substrate.

The gate metal layer 50 applies a gate voltage to the semiconductor device 100. The gate metal layer 50 may be connected to a gate pad provided above the upper surface of the semiconductor substrate. The gate pad is connected to an external device by a wire or the like. The gate metal layer 50 may be provided to surround the active region in a top plan view. As an example, the gate metal layer 50 is provided to be loop-shaped along an outer periphery of the semiconductor substrate in the top plan view.

The gate metal layer 50 is in contact with a gate runner 48 through contact hole 49. The gate runner 48 is formed of polysilicon or the like doped with impurities. An insulation film such as a thermal oxide film is provided between the gate runner 48 and the semiconductor substrate. The gate runner 48 is connected to a gate conductive portion in the gate trench portion 40 on the upper surface of the semiconductor substrate. The gate runner 48 is not connected to the dummy conductive portion in the dummy trench portion 30. The gate runner 48 of this example is provided from a position overlapping the contact hole 49 to a position overlapping an edge portion 41 of the gate trench portion 40. The edge portion 41 is an end portion, in the gate trench portion 40, closest to the gate metal layer 50. At the edge portion 41 of the gate trench portion 40, the gate conductive portion is exposed on the upper surface of the semiconductor substrate, and is in contact with the gate runner 48.

The emitter electrode 52 and the gate metal layer 50 are formed of a material including a metal. For example, at least a part of a region of each electrode is formed of aluminum or an aluminum-silicon alloy. Each electrode may have a barrier metal formed of titanium, a titanium compound, or the like below a region formed of aluminum or the like. Further, a plug, which is formed by embedding tungsten or the like so as to be in contact with the barrier metal and aluminum or the like, may be included in the contact hole.

The well region 11 is provided to overlap the gate metal layer 50 and the gate runner 48. The well region 11 is provided to extend with a predetermined width up to a range not overlapping the gate metal layer 50 and the gate runner 48. The well region 11 of this example is provided away from an end of the contact hole 54 in a Y axis direction to the gate metal layer 50 side. The well region 11 is a region of the second conductivity type. The well region 11 in this example is of the P+ type.

The semiconductor device 100 has a plurality of trench portions arranged in an X axis direction. Hereinafter, in the specification, an arrangement direction is referred to as the X axis direction. In the semiconductor device 100 of this example, one or more gate trench portions 40 and one or more dummy trench portions 30 are provided along the X axis direction.

The gate trench portion 40 of this example may have two extension portions 39 extending along an extension direction (the Y axis direction) perpendicular to the arrangement direction (the X axis direction) of the trench portion (the two extension portions that are linear along the extension direction), and the edge portion 41 connecting the two extension portions 39. Hereinafter, in the specification, the extension direction is referred to as the Y axis direction. Further, the dummy trench portion 30 of this example may have two extension portions 29 extending along the extension direction and an edge portion 31 connecting the two extension portions 29.

It is preferable that at least a part of the edge portion 41 is provided in a curved shape in the top plan view. Since end portions of the two extension portions 39 in the Y axis direction are connected to each other by the edge portion 41, it is possible to relax the electric field concentration at the end portions of the extension portions 39.

In this example, the dummy trench portions 30 are provided between the respective extension portions 39 of the gate trench portions 40. In this example, two dummy trench portions 30 are provided between the respective extension portions 39; however, one dummy trench portion 30 may be provided between the respective extension portions 39.

A diffusion depth of the well region 11 may be deeper than depths of the gate trench portion 40 and the dummy trench portion 30. The end portions of the gate trench portion 40 and the dummy trench portion 30 in the Y axis direction are provided in the well region 11 in the top plan view. That is, at the end portion of each trench portion in the Y axis direction, a bottom portion of each trench portion in the depth direction is covered with the well region 11. Accordingly, it is possible to relax the electric field concentration at the bottom portion of each trench portion.

In the arrangement direction, a mesa portion 60 is provided between the respective trench portions. The mesa portion 60 indicates a region interposed between the trench portions inside the semiconductor substrate. An upper end of the mesa portion 60 may be the upper surface of the semiconductor substrate. A depth position of a lower end of the mesa portion 60 may be the same as a depth position of a lower end of each trench portion. The mesa portion 60 of this example is provided to extend in the extension direction along each trench portion, on the upper surface of the semiconductor substrate.

Each of the mesa portions 60 is provided with a base region 14 of the second conductivity type, the base region 14 being shallower than the trench portion. The base region 14 in this example is of the P-type. The base region 14 is provided, in alignment with the well region 11 in the extension direction, to be exposed on the upper surface of the semiconductor substrate. While FIG. 1 shows the base region 14 disposed at one end portion of each mesa portion 60, the base region 14 is also disposed at the other end portion of each mesa portion 60. The base region 14 is interposed between the two trench portions in the X axis direction, and is provided in contact with the two trench portions.

Each mesa portion 60 is provided with the emitter region 12 of the first conductivity type and the contact region 15 of the second conductivity type. In this example, a cell 13 of an IGBT element is formed by the emitter region 12 and the contact region 15. The cell 13 of the IGBT element is a basic structure of the IGBT element, and a large number of basic structures are disposed to constitute a whole semiconductor device 100. The emitter region 12 in this example is of the N+ type. The contact region 15 of this example is of the P+ type. The dopant of the emitter region 12 is, for example, arsenic (As), phosphorus (P), antimony (Sb), or the like.

The base region 14 is provided below the emitter region 12 and the contact region 15. The base region 14 provided below the emitter region 12 and the contact region 15 is connected, inside the semiconductor substrate, to the base region 14 disposed in alignment with the well region 11 in the extension direction. The emitter region 12 and the contact region 15 may be provided between the base region 14 and the upper surface of the semiconductor substrate in the depth direction of the semiconductor substrate.

The emitter region 12 and the contact region 15 are provided in contact with the gate trench portion 40. The emitter region 12 and the contact region 15 may or may not be in contact with the dummy trench portion 30. In this example, the emitter region 12 and the contact region 15 are provided in contact with the dummy trench portion 30.

The emitter region 12 is provided in alignment with the contact region 15 in the extension direction on the upper surface of the semiconductor substrate. The emitter regions 12 and the contact regions 15 may be alternately provided in alignment with each other in the extension direction. That is, in the extension direction, the emitter region 12 may be interposed between two contact regions 15, and the contact region 15 may be interposed between two emitter regions 12.

The contact hole 54 is provided above the mesa portion 60. Further, the emitter region 12 is also provided below the contact hole 54. The emitter region 12 of this example is in contact with each of the two trench portions and is provided from one to the other of the two trench portions.

In a region which is below the contact hole 54 and is interposed between the contact regions 15 in the arrangement direction on the upper surface of the semiconductor substrate, a plug region 17 of the second conductivity type is provided. In FIG. 1, the region where the plug region 17 is provided is indicated by broken lines. The plug region 17 in this example is of a P++ type. That is, a doping concentration of the plug region 17 is higher than a doping concentration of the contact region 15 (see FIG. 8). In particular, a dose of the plug region 17 of this example, that is, an implantation amount of the dopant of the second conductivity type is greater than or equal to a dose of the contact region 15. That is, a first integrated concentration obtained by integrating the doping concentration of the plug region 17 in the depth direction of the semiconductor substrate is higher than or equal to a second integrated concentration obtained by integrating the doping concentration of the contact region 15 in the depth direction of the semiconductor substrate.

The plug region 17 is provided in contact with the upper surface of the semiconductor substrate. Below the plug region 17, the contact region 15 is provided. That is, the plug region 17 is provided to be shallower than the contact region 15 in depth. The contact region 15 provided below the plug region is connected, inside the semiconductor substrate, to two contact regions 15 provided across the plug region 17 in the top plan view.

An accumulation region 16 of the first conductivity type may be provided below the emitter region 12, the contact region 15, and the plug region 17. The accumulation region 16 of this example has an impurity concentration higher than a drift region, and is of the N type. The accumulation region 16 may be disposed above the lower end of each trench portion. In FIG. 1, a range where the accumulation region 16 is provided is indicated by a dashed line and an arrow. An end portion of the accumulation region 16 in the Y axis direction may be disposed below the contact region 15 which is provided to be interposed between the emitter region 12 and the base region 14 on the upper surface of the semiconductor substrate. By providing the accumulation region 16, it is possible to improve a carrier injection enhancement effect (IE effect) to reduce an ON voltage.

Figure 2:
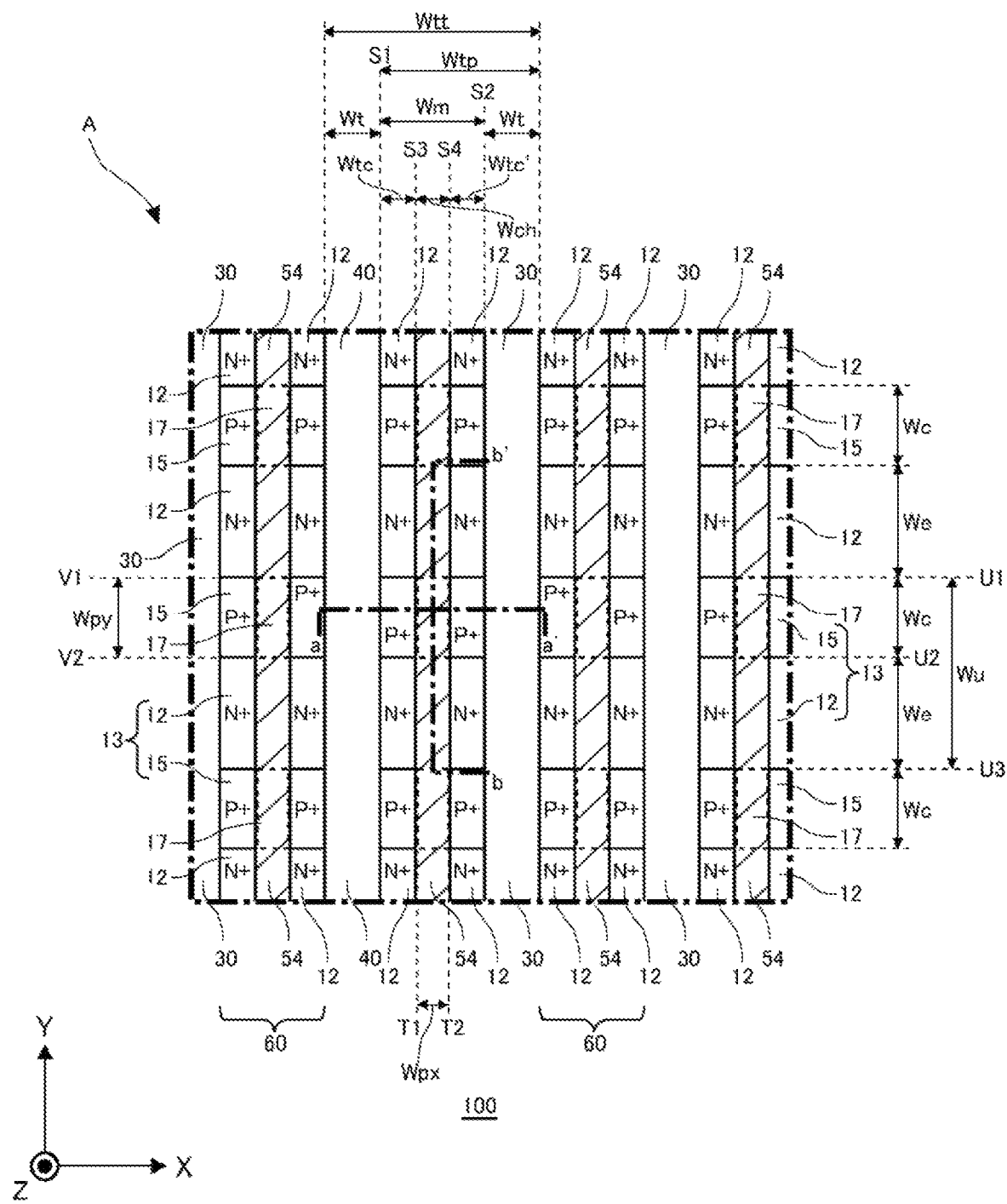
FIG. 2 is an enlarged view of a region A in FIG. 1.

FIG. 2 is an enlarged view of a region A in FIG. 1. As shown in FIG. 2, in the semiconductor device 100 of this example, the emitter region 12 and the contact region 15 are provided in contact with the gate trench portion 40 and the dummy trench portion 30. Further, in a region which is below the contact hole 54 and is interposed between the contact regions 15 in the arrangement direction on the upper surface of the semiconductor substrate, the plug region 17 is provided.

In the X axis direction, a position of an end portion of the gate trench portion 40 on a positive side of the X axis is defined as a position S1. In the X axis direction, a position of an end portion of the dummy trench portion 30 on a negative side of the X axis, the dummy trench portion 30 being disposed adjacent to the gate trench portion 40 on the positive side of the X axis, is defined as a position S2. In the mesa portion 60 interposed between the gate trench portion 40 and the dummy trench portion 30, positions of end portions of the contact hole 54 on the negative side of the X axis and the positive side of the X axis are respectively defined as a position S3 and a position S4.

A width Wm is a width in the X axis direction between the position S1 and the position S2, that is, a width of the mesa portion 60. A width Wtt is a width between the adjacent two of the trench portions in the arrangement direction (the X axis direction). A width Wt is a width of the gate trench portion 40 in the X axis direction and a width of the dummy trench portion 30 in the X axis direction. A width Wtp is a trench pitch between the two trench portions provided adjacent to each other in the X axis direction. A width Wtc is a width in the X axis direction between the position S1 and the position S3. A width Wtc' is a width in the X axis direction between the position S4 and the position S2. A width Wch is a width in the X axis direction between the position S3 and the position S4, that is, an opening width of the contact hole 54. Note that the width Wtc may be equal to the width Wtc'.

The width Wch may be equal to the width Wtc and the width Wtc'. The width Wm may be not less than 1.2 times and not more than 3 times the width Wch. Further, the width Wm may be not less than 1.4 times and not more than 3 times the width Wtc. The width Wt may be not less than 1.5 times and not more than 3 times the width Wch. The width Wt may be not less than 1.5 times and not more than 3 times the width Wtc. The width Wtp may be not less than 1.3 times and not more than 2.5 times the width Wm. The width Wch may be different from the width Wtc and the width Wtc'. The width Wtc and the width Wtc' may be not less than 0.5 times and not more than 2 times the width Wch.

The width Wtt may be 4 μm or less, preferably 3.2 μm or less. The width Wch may be 0.2 μm or more and 0.9 μm or less. The width Wch may be 1.0 μm or less in this example. The width Wt may be 0.5 μm or more and 1.2 μm or less. The width Wtc and the width Wtc' may be 0.2 μm or more and 0.9 μm or less. The width Wtp may be 2.0 μm or more and 2.8 μm or less. Further, the width Wch may be smaller than width Wtc and width Wtc'. The width Wch, the width Wtc, and the width Wtc' may be smaller than the width Wt.

In the Y axis direction, a position of an end portion of the contact region 15 on the positive side of the Y axis in the top plan view is defined as a position U1. In the Y axis direction, a position, which is a position of an end portion of the contact region 15 on the negative side of the Y axis in the top plan view and a position of an end portion of the emitter region 12 on the positive side in the Y axis, the emitter region 12 being provided adjacent to the contact region 15 on the negative side of the Y axis, is defined as a position U2. In the Y axis direction, a position of an end portion of the emitter region 12 on the negative side of the Y axis is defined as a position U3.

One contact region 15 and one emitter region 12 provided adjacent to each other in the Y axis direction are referred to as the cell 13. A length Wu is a pitch of the cell 13 in the Y axis direction. The length Wu is equal to a sum of a length We and a length Wc. The length We is a length of the emitter region 12 in the Y axis direction. The length Wc is a length of the contact region 15 in the Y axis direction in the top plan view. In this example, the length Wc is smaller than the length We. The length Wc may be not less than 0.6 times and not more than 0.9 times the length We. The length We may be 1.2 μm or more and 2.1 μm or less. The length Wc may be 0.9 μm or more and 1.4 μm or less.

In this example, the length Wu of the cell 13 is set to be the width Wtt or less. Further, the width Wch, which is the opening width of the contact hole 54, is set to be smaller than the length Wc of the contact region 15. Accordingly, the cell 13 is not rectangular longitudinally in the Y axis direction in the top plan view, and thus it is possible to increase a density of the cell 13 in the Y axis direction. Furthermore, in the cell 13, since the length We is greater than the length Wc, a total emitter length (a length at which the emitter region 12 is in contact with the trench portion in the Y axis direction) can be secured while miniaturization and sophistication are achieved. However, in a case of such a disposition, an RBSOA tolerance may decrease. Hence, the plug region 17 of this example is employed in the semiconductor device 100.

Further, in this example, the width Wch, which is the opening width of the contact hole 54, is smaller than the width Wt of the trench portion. Accordingly, the miniaturization and the sophistication can be suitably achieved.

In the top plan view, at least a part of the plug region 17 is disposed to overlap the contact region 15. That is, in the top plan view, the contact region 15 is provided below the plug region 17, and at least a part of the plug region 17 overlaps the contact region 15. In this example, in the top plan view, a whole plug region 17 is disposed to overlap the contact region 15.

In the X axis direction, positions of end portions of the plug region 17 on the negative side of the X axis and the positive side of the X axis are respectively defined as a position T1 and a position T2. A width Wpx is a width in the X axis direction between the position T1 and the position T2. In this example, the position T1 is equal to the position S3, and the position T2 is equal to the position S4. That is, in this example, the width Wpx is equal to the width Wch.

In the Y axis direction, positions of end portions of the plug region 17 on the positive side of the Y axis and the negative side of the Y axis are respectively defined as a position V1 and a position V2. In this example, a length Wpy is a length in the Y axis direction between the position V1 and the position V2. In this example, position V1 is equal to the position U1, and position V2 is equal to the position U2. That is, in this example, the length Wpy is equal to the length Wc.

Figure 3:
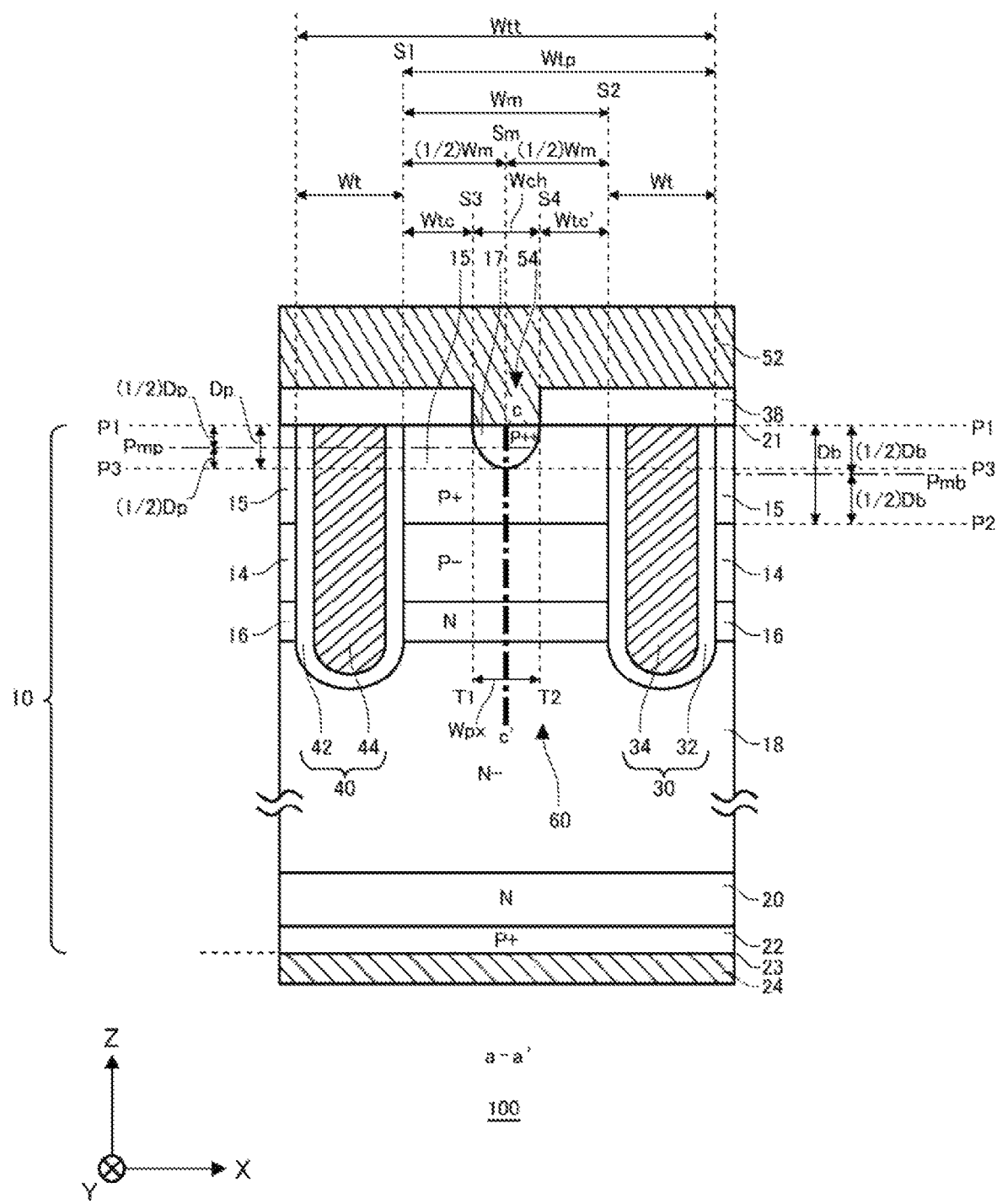
FIG. 3 is a view showing an example of a cross section a-a' in FIG. 2.

FIG. 3 is a view showing an example of a cross section a-a' in FIG. 2. The cross section a-a' is an XZ plane passing through the gate trench portion 40, the dummy trench portion 30, the contact region 15, and the plug region 17. In the cross section, the semiconductor device 100 of this example has a semiconductor substrate 10, an interlayer dielectric film 38, the emitter electrode 52, and a collector electrode 24. The interlayer dielectric film 38 is provided on an upper surface 21 of the semiconductor substrate 10. The interlayer dielectric film 38 is an insulation film such as silicate glass to which impurities such as boron or phosphorus are added. The interlayer dielectric film 38 may be in contact with the upper surface 21, and another film such as an oxide film may be provided between the interlayer dielectric film 38 and the upper surface 21. In the interlayer dielectric film 38, the contact hole 54, the contact hole 49, and the contact hole 56 which are described in FIG. 1 are provided. FIG. 3 shows the contact hole 54.

The emitter electrode 52 is provided above the interlayer dielectric film 38. The emitter electrode 52 is electrically in contact with the upper surface 21 through the contact hole 54 of the interlayer dielectric film 38. Inside the contact hole 54, a contact plug of tungsten (W) or the like may be provided. The collector electrode 24 is provided on a lower surface 23 of the semiconductor substrate 10. The emitter electrode 52 and the collector electrode 24 are provided by using a conductive material such as a metal.

The semiconductor substrate 10 may be a silicon substrate, a silicon carbide substrate, or a nitride semiconductor substrate such as gallium nitride. The semiconductor substrate 10 of this example is a silicon substrate.

The semiconductor substrate 10 includes a drift region 18 of the first conductivity type. The drift region 18 of this example is of the N− type. The drift region 18 may be a remaining region where another doping region is not provided in the semiconductor substrate 10.

Above the drift region 18, one or more accumulation regions 16 may be provided. As an example, the semiconductor device 100 shown in FIG. 3 is provided with one accumulation region 16 in a Z axis direction. When a plurality of accumulation regions 16 is provided, the accumulation regions 16 may be respectively arranged in the Z axis direction. The accumulation region 16 may be provided above the lower end of each trench portion. The accumulation region 16 has a higher doping concentration than the drift region 18. By providing the accumulation region 16, it is possible to improve a carrier injection enhancement effect (IE effect) to reduce an ON voltage.

Above the accumulation region 16, the base region 14 is provided. Above the base region 14, the contact region 15 is provided. The accumulation region 16, the base region 14, and the contact region 15 are provided in contact with the gate trench portion 40. The accumulation region 16, the base region 14, and the contact region 15 may be provided in contact with the dummy trench portion 30.

Inside the contact region 15, the plug region 17 is provided in contact with the upper surface 21. The plug region 17 is provided below the contact hole 54. In this example, the width Wpx of the plug region 17 in the X axis direction is equal to the width Wch of the contact hole 54 in the X axis direction.

A center position of the mesa portion 60 in the X axis direction is defined as a position Sm. In the X axis direction, the plug region 17 may be provided symmetrically about the position Sm as the center between the positive side and the negative side in the X axis.

In the Z axis direction, a position of the upper surface 21 is defined as a position P1. In the Z axis direction, a position of a lower end of the contact region 15 is defined as a position P2. In the Z axis direction, a position of a lower end of the plug region 17 is defined as a position P3. A depth Db is a depth in the Z axis direction between the position P1 and the position P2, that is, a depth of the contact region 15 from the upper surface 21. A depth Dp is a depth in the Z axis direction between the position P1 and the position P3, that is, a depth of the plug region 17 from the upper surface 21.

In the Z axis direction, a midpoint between the position P1 and the position P2 is defined as a position Pmb. That is, the position Pmb is a center position of the contact region 15 in the depth direction. In the Z axis direction, a midpoint between the position P1 and the position P3 is defined as a position Pmp. That is, the position Pmp is a center position of the plug region 17 in the depth direction.

In the semiconductor device 100 of this example, the plug region 17 is provided at a position shallower than the contact region 15 in the depth direction. The expression that the plug region 17 is provided at a position shallower than the contact region 15 in the depth direction may indicate that the lower end of the plug region 17 is disposed above the lower end of the contact region 15. That is, the expression may indicate that the position P3 is positioned above the position P2. The depth Dp of the plug region 17 from the upper surface 21 may be not less than 0.1 times and not more than 0.6 times the depth Db of the contact region 15 from the upper surface 21. Note that the depth Dp of the plug region 17 from the upper surface 21 may be shallower than the position Pmb which is half the depth Db of the contact region 15 from the upper surface 21.

Further, the expression that the plug region 17 is provided at a position shallower than the contact region 15 in the depth direction may mean that the center position of the plug region 17 in the depth direction is disposed above the center position of the contact region 15 in the depth direction. That is, the expression may indicate that the position Pmp is positioned above the position Pmb. A depth of the plug region 17 from the upper surface 21 to the position Pmp, which is half (½) Dp, may be not less than 0.1 times and not more than 0.6 times a depth of the contact region 15 from the upper surface 21 to the position Pmb, which is half (½) Db.

In this example, the width Wch, which is the opening width of the contact hole 54, is greater than the depth Dp. In other words, the depth of the plug region 17 is smaller than the opening width of the sophisticated contact hole 54. This means that the plug region 17 is a high concentration region provided on a front surface of the semiconductor substrate in order to avoid a decrease in RBSOA tolerance, and that there is no need of a deep diffusion of the plug region 17.

Below the drift region 18, a buffer region 20 of the first conductivity type may be provided. The buffer region 20 of this example has an impurity concentration higher than the drift region 18, and is of the N type. The buffer region 20 has a higher doping concentration than the drift region 18. The buffer region 20 may function as a field stop layer which prevents a depletion layer from reaching a collector region 22 of a P+ type, the depletion layer widening from a lower end of the base region 14. The buffer region 20 may have a plurality of peaks or a single peak in a doping concentration distribution in the depth direction.

Below the buffer region 20, the collector region 22 of the second conductivity type is provided. The collector region 22 of this example is of the P+ type. The collector region 22 is provided to be exposed on the lower surface 23 of the semiconductor substrate 10.

The semiconductor substrate 10 is provided with the gate trench portion 40 and the dummy trench portion 30. The gate trench portion 40 and the dummy trench portion 30 are provided to pass through the base region 14 and the accumulation region 16 from the upper surface 21, and to reach the drift region 18. A structure in which the trench portion passes through the doping region is not limited to a structure in which the semiconductor substrate is manufactured in order of forming the doping region and then forming the trench portion. A structure in which the trench portion is formed and then the doping region is formed between the trench portions is also included in the structure in which the trench portion passes through the doping region.

The gate trench portion 40 has a gate trench, a gate insulation film 42, and a gate conductive portion 44 which are provided on the upper surface 21. The gate insulation film 42 is provided to cover an inner wall of the gate trench. The gate insulation film 42 may be formed by oxidizing or nitriding a semiconductor on the inner wall of the gate trench. The gate conductive portion 44 is provided on an inner side further than the gate insulation film 42 inside the gate trench. The gate insulation film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 is covered with the interlayer dielectric film 38 on the upper surface 21. When a predetermined voltage is applied to the gate conductive portion 44, a channel is formed by an electron inversion layer on a surface layer in the base region 14 at an interface in contact with the gate trench.

The dummy trench portion 30 may have the same structure as the gate trench portion 40 in an XZ cross section. The dummy trench portion 30 has a dummy trench, a dummy insulation film 32, and a dummy conductive portion 34 which are provided on the upper surface 21. The dummy insulation film 32 is provided to cover an inner wall of the dummy trench. The dummy insulation film 32 may be formed by oxidizing or nitriding the semiconductor on the inner wall of the dummy trench. The dummy conductive portion 34 is provided on an inner side further than the dummy insulation film 32 inside the dummy trench. The dummy insulation film 32 insulates the dummy conductive portion 34 from the semiconductor substrate 10. The dummy conductive portion 34 may be formed of the same material as the gate conductive portion 44.

The gate trench portion 40 and the dummy trench portion 30 of this example are covered with the interlayer dielectric film 38 on the upper surface 21. Note that bottom portions of the dummy trench portion 30 and the gate trench portion 40 may have curved surfaces which are convex downward (curved line shapes in cross sections).

Figure 4:
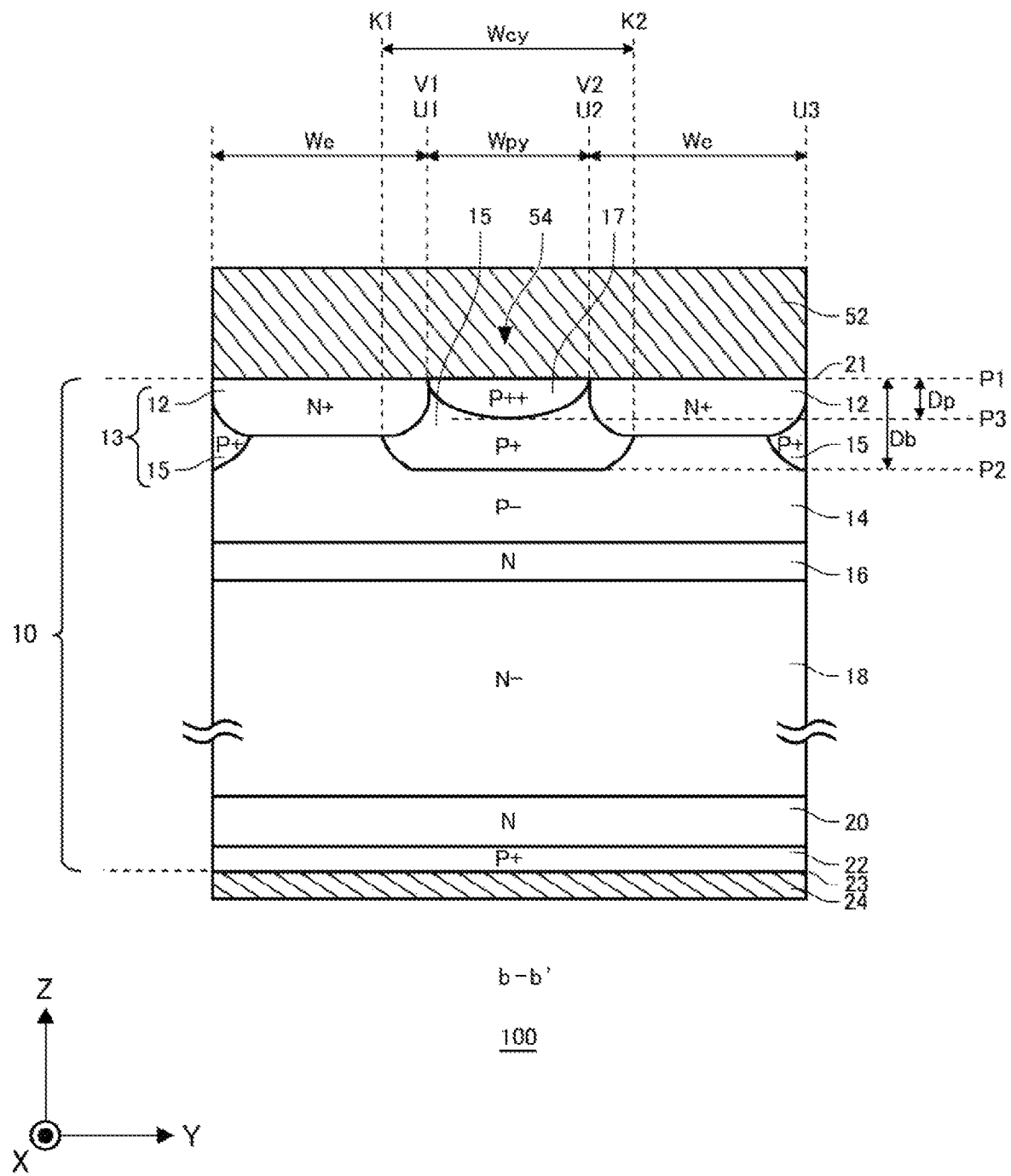
FIG. 4 is a view showing an example of a cross section b-b' in FIG. 2.

FIG. 4 is a view showing an example of a cross section b-b' in FIG. 2. The cross section b-b' is a YZ plane passing through the contact hole 54, the emitter region 12, and the plug region 17. In the cross section, the semiconductor device 100 of this example has the semiconductor substrate 10, the emitter electrode 52, and the collector electrode 24.

In the cross section b-b', above the base region 14, the emitter region 12, the contact region 15, and the plug region 17 are provided. The emitter region 12 and the plug region 17 are provided to be exposed on the upper surface 21. In the cross section b-b', the contact region 15 is not exposed on the upper surface 21.

In the depth direction, a lower end of the emitter region 12 may be provided above the lower end of the contact region 15. In the depth direction, the lower end of the emitter region 12 may be provided below or above the lower end of the plug region 17. The lower end of the emitter region 12 of this example is provided below the lower end of the plug region 17.

Positions of end portions of the contact region 15 on the negative side of the Y axis and the positive side of the Y axis, at the lower end of the emitter region 12, are respectively defined as a position K1 and a position K2. A length Wcy is a length in the Y axis direction between the position K1 and the position K2. In the top plan view, the end portion of the emitter region 12 in the Y axis direction may overlap the end portion of the contact region 15 in the Y axis direction. That is, the position K1 may be disposed on the negative side of the Y axis further than the position U1. The position K2 may be disposed on the positive side of the Y axis further than the position U2.

The plug region 17 may be provided to overlap the contact region 15 in the Y axis direction in the top plan view. That is, the position V1 of the end portion of the plug region 17 on the negative side of the Y axis may be disposed on the positive side of the Y axis further than the position K1. The position V2 of the end portion of the plug region 17 on the positive side of the Y axis may be disposed on the negative side of the Y axis further than the position K2. The length Wcy may be greater than the length Wpy.

When the length Wu of the cell 13 is smaller than or equal to the width Wtt, due to the miniaturization and the sophistication described above, a contact area between the emitter electrode 52 and the contact region 15 in the XY plane is limited, and thus a contact resistance between the emitter electrode 52 and the contact region 15 increases. Note that the contact resistance also increases when a barrier metal or a tungsten plug is interposed between the emitter electrode 52 and the contact region 15. In a sophisticated element with a length Wu of 3.2 μm or less, the contact resistance remarkably tends to increase. Further, also in a sophisticated element with a width Wtp of 3.0 μm or less, the contact resistance may increase. Therefore, the semiconductor device 100 easily causes a latch-up due to the miniaturization and the sophistication. Therefore, the RBSOA tolerance of the semiconductor device 100 easily decreases.

The semiconductor device 100 of this example includes the plug region 17 provided inside the semiconductor substrate 10. The plug region 17 has the higher doping concentration than the contact region 15. Further, in the top plan view, at least a part of the plug region 17 is disposed to overlap the contact region 15. Further, the plug region 17 is provided at a position shallower than the contact region 15 in the depth direction. Further, the dose of the plug region 17 in this example is set to be greater than or equal to the dose of the contact region 15. Therefore, even when the semiconductor device 100 is sophisticated, the latch-up is less likely to occur. Therefore, a decrease in the RBSOA tolerance of the semiconductor device 100 can be prevented. Further, a variation in RBSOA tolerance of the semiconductor device 100 can be suppressed.

Figure 5:
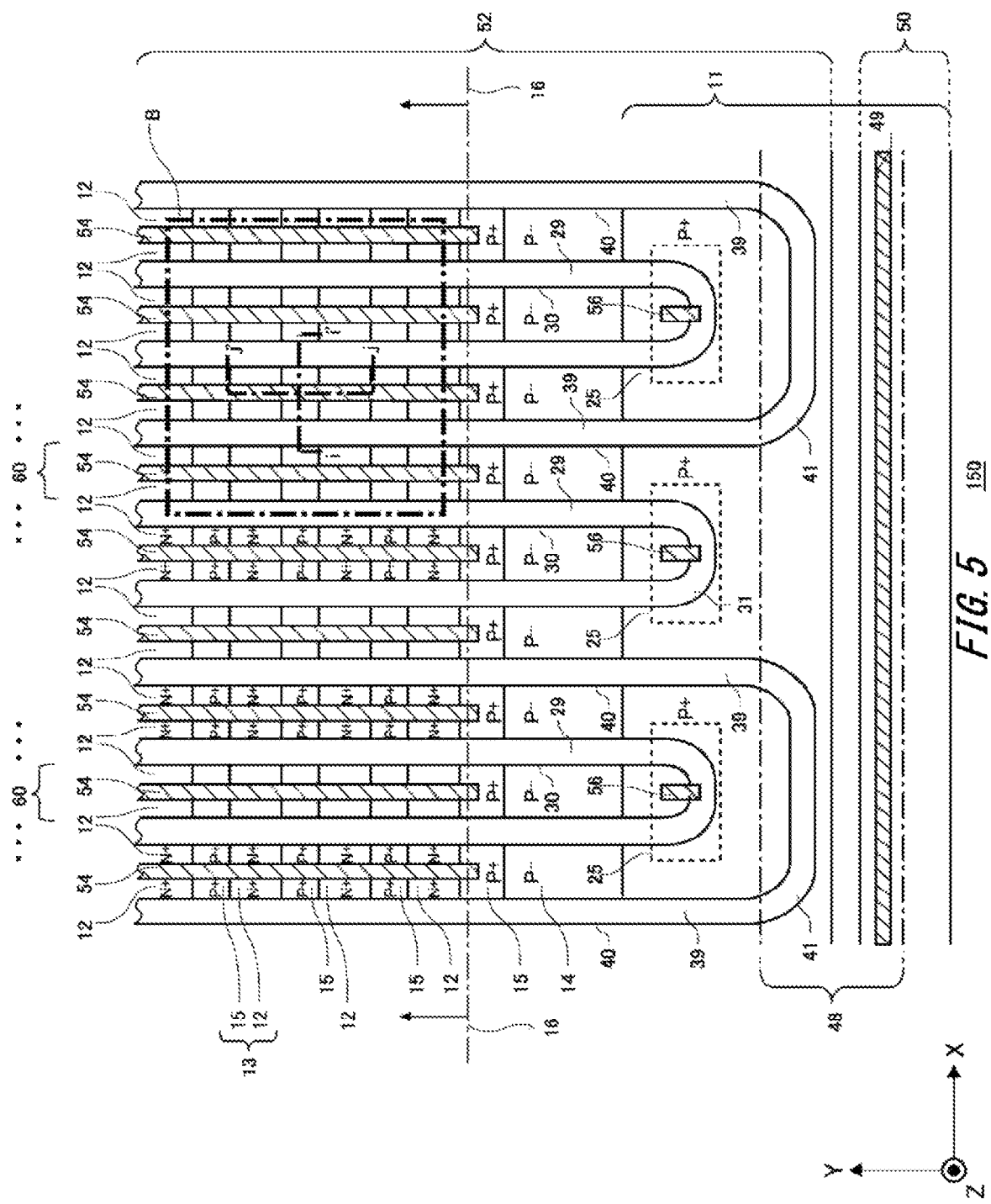
FIG. 5 is a view showing an upper surface of a semiconductor device 150 of Comparative Example.

FIG. 5 is a view showing an upper surface of a semiconductor device 150 of Comparative Example. The semiconductor device 150 of Comparative Example is different from the semiconductor device 100 of this example shown in FIG. 1 in that the plug region 17 is not provided.

Figure 6:
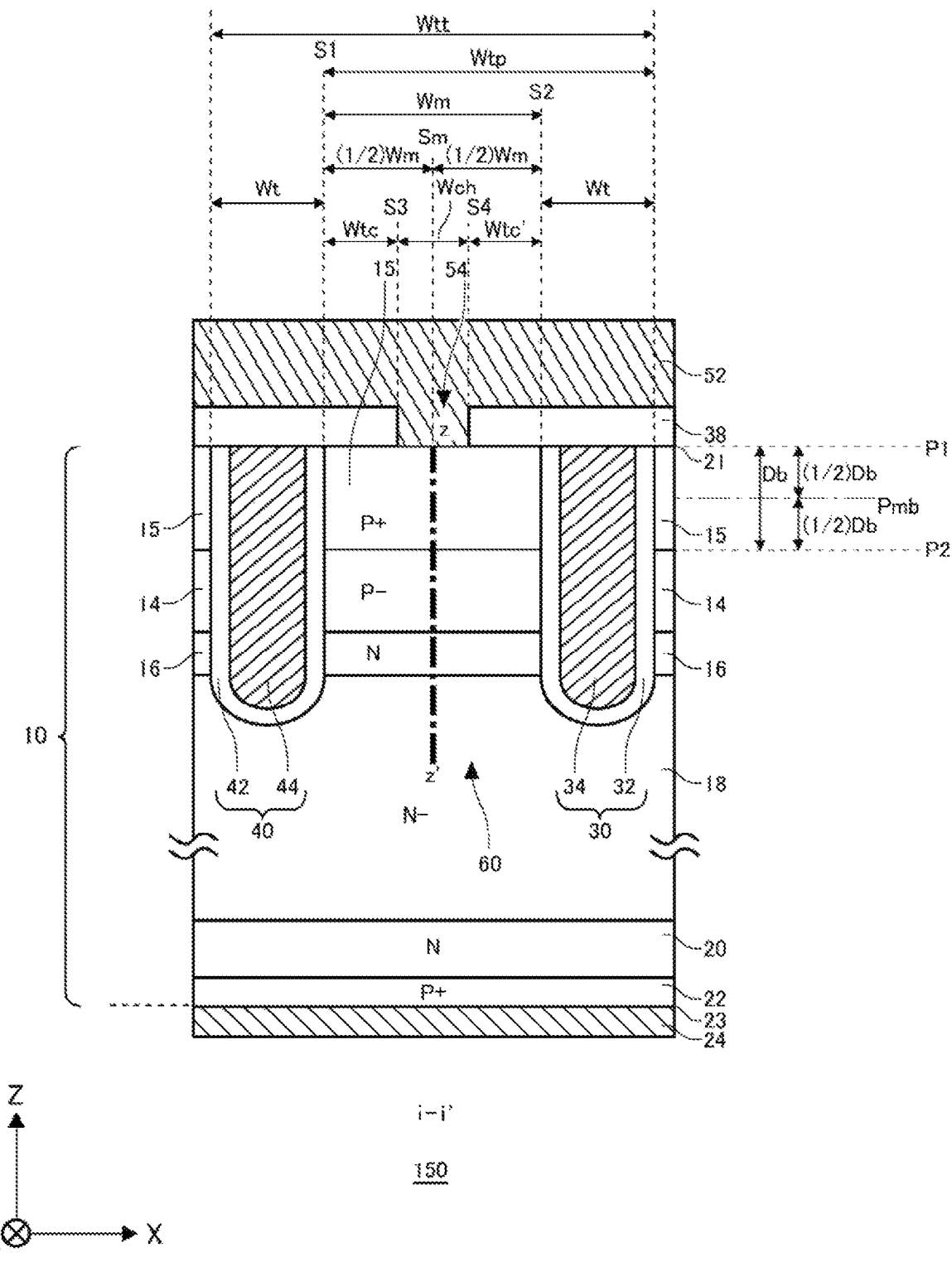
FIG. 6 is a view showing a cross section i-i' in FIG. 5.

FIG. 6 is a view showing a cross section i-i' in FIG. 5. In the cross section i-i', the semiconductor device 150 of Comparative Example is not provided with the plug region 17. In the semiconductor device 150 of Comparative Example, the contact region 15 is exposed on the upper surface 21 below the contact hole 54.

Figure 7:
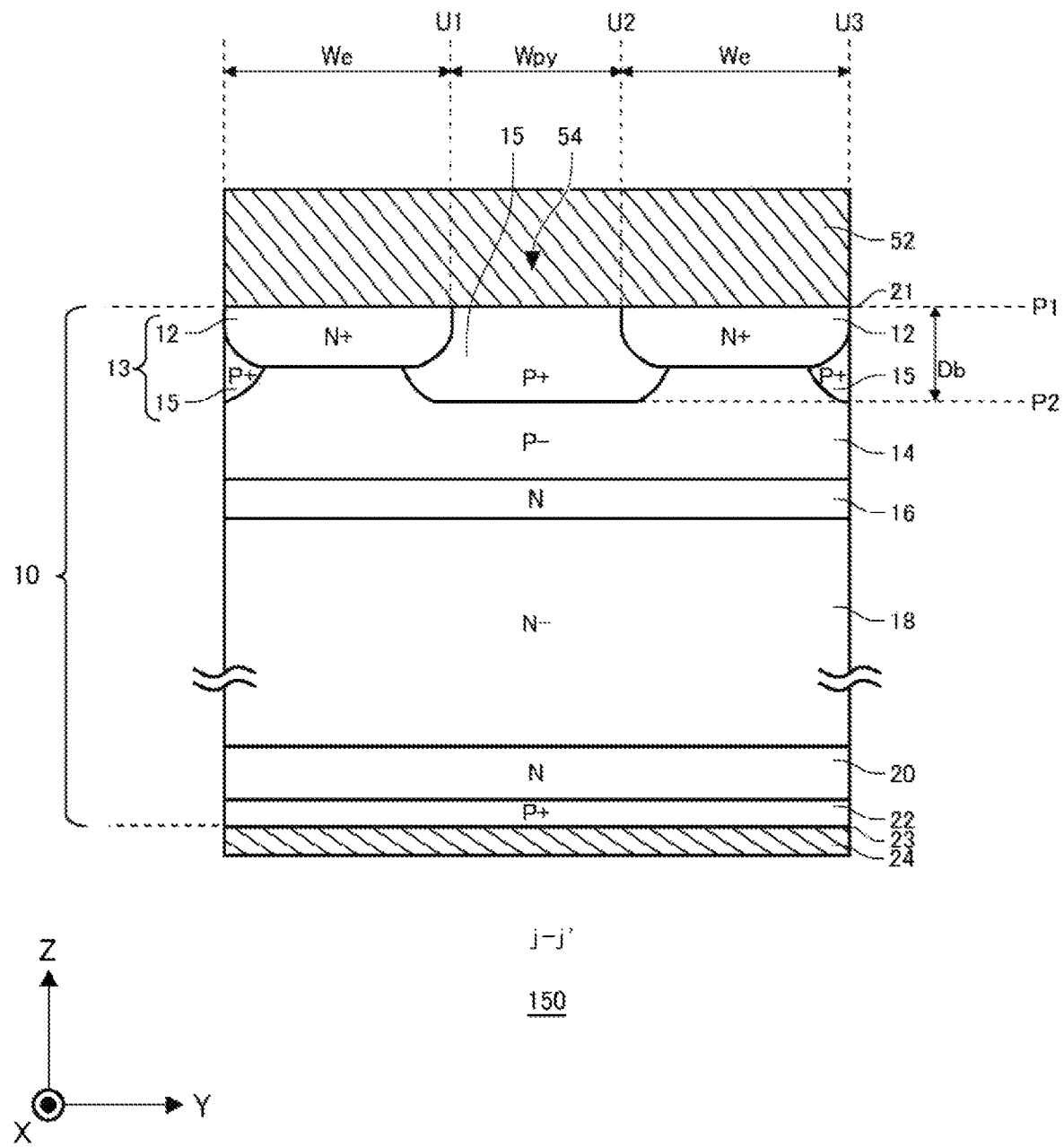
FIG. 7 is a view showing a cross section j-j' in FIG. 5.

FIG. 7 is a view showing a cross section j-j' in FIG. 5. In the cross section j-j', the semiconductor device 150 of Comparative Example is not provided with the plug region 17. In the semiconductor device 150 of Comparative Example, the contact region 15 is exposed on the upper surface 21 in a region interposed between the emitter regions 12.

The semiconductor device 150 of Comparative Example is not provided with the plug region 17. Therefore, when the semiconductor device 150 is sophisticated, the latch-up easily occurs. Therefore, the RBSOA tolerance of the semiconductor device 150 easily decreases. Further, it is difficult to suppress a variation in RBSOA tolerance of the semiconductor device 150.

Figure 8:
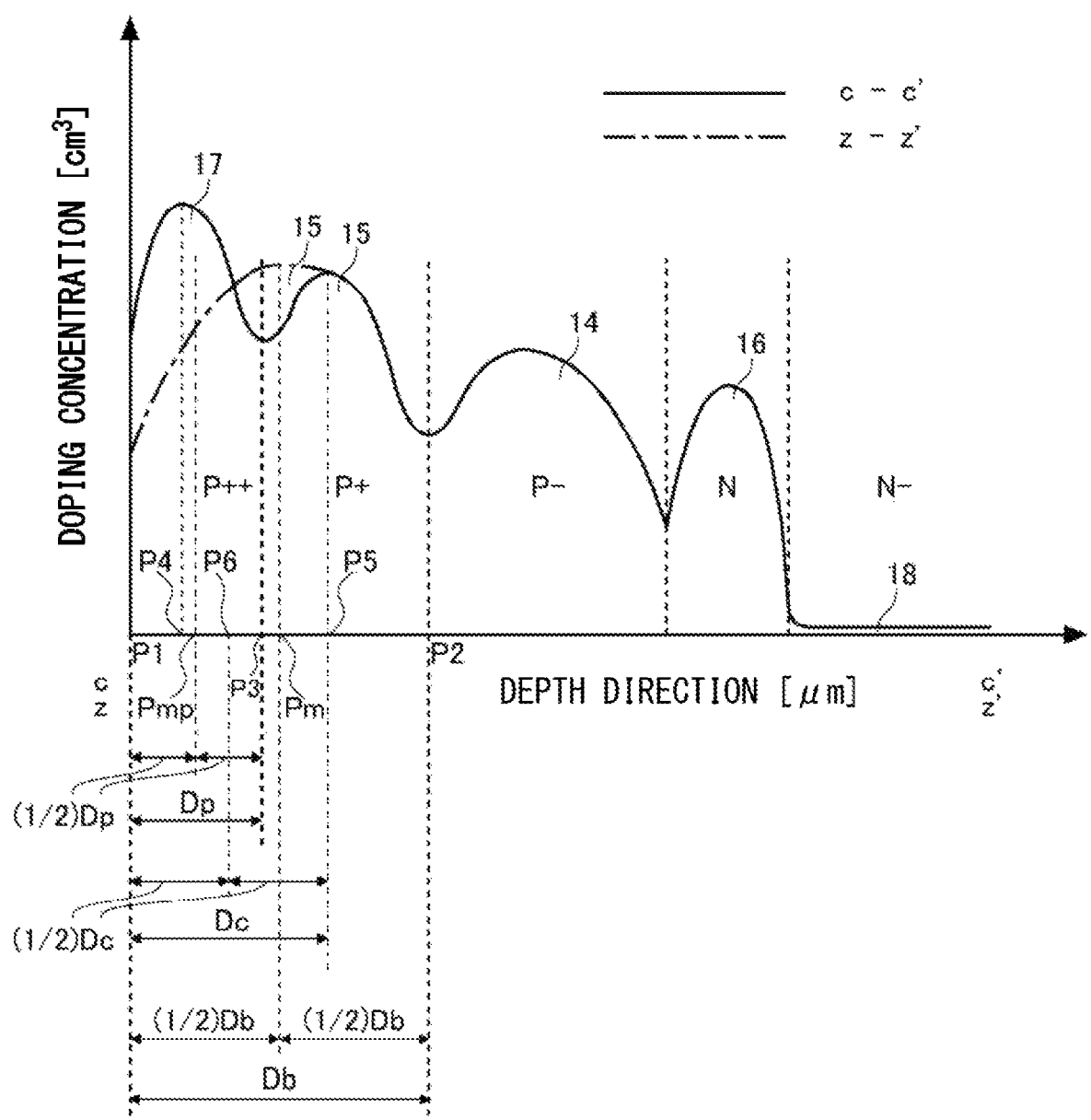
FIG. 8 is a graph showing an example of a doping concentration distribution along a cross section c-c' in FIG. 3

FIG. 8 is a graph showing an example of a doping concentration distribution along a cross section c-c' in FIG. 3

FIG. 8 also shows the doping concentration distribution along a cross section z-z' in FIG. 6. As shown in FIG. 8, a peak concentration of the doping concentration of the plug region 17 in the semiconductor device 100 of this example is higher than a peak concentration of the doping concentration of the contact region 15. Further, in the semiconductor device 100 of this example, the first integrated concentration obtained by integrating the doping concentration of the plug region 17 in the depth direction of the semiconductor substrate 10 is higher than or equal to the second integrated concentration obtained by integrating the doping concentration of the contact region 15 in the depth direction of the semiconductor substrate 10. Therefore, the increase in the contact resistance between the emitter electrode 52 and the contact region 15 is suppressed more in the semiconductor device 100 of this example than in the semiconductor device 150 of Comparative Example. Therefore, the latch-up is less likely to occur, and the RBSOA tolerance is less likely to decrease in the semiconductor device 100 of this example than in the semiconductor device 150 of Comparative Example.

In the depth direction, a peak position of the doping concentration of the plug region 17 is defined as a position P4. In the depth direction, a peak position of the doping concentration of the contact region 15 in the depth direction is defined as a position P5. In the depth direction, the position P4 may be provided at a position shallower than the position P5. That is, the plug region 17 of this example is a disposed region where a dose greater than or equal to the dose of the contact region 15 is concentrated at a depth shallower than the contact region 15. Accordingly, an effect of suppressing the decrease in RBSOA tolerance is exhibited.

A depth from the upper surface 21 to the peak position (the position P5) of the doping concentration of the contact region 15 is defined as a depth Dc. In the depth direction, a position at a depth half the depth Dc from the upper surface 21 is defined as a position P6. In the depth direction, the peak position (the position P4) of the doping concentration of the plug region 17 may be provided at a position shallower than the position P6. In the semiconductor device 100 of this example, the plug region 17 may be provided at a position shallower than half the depth Dc up to the peak position P5 of the doping concentration of the contact region 15.

Figure 9:
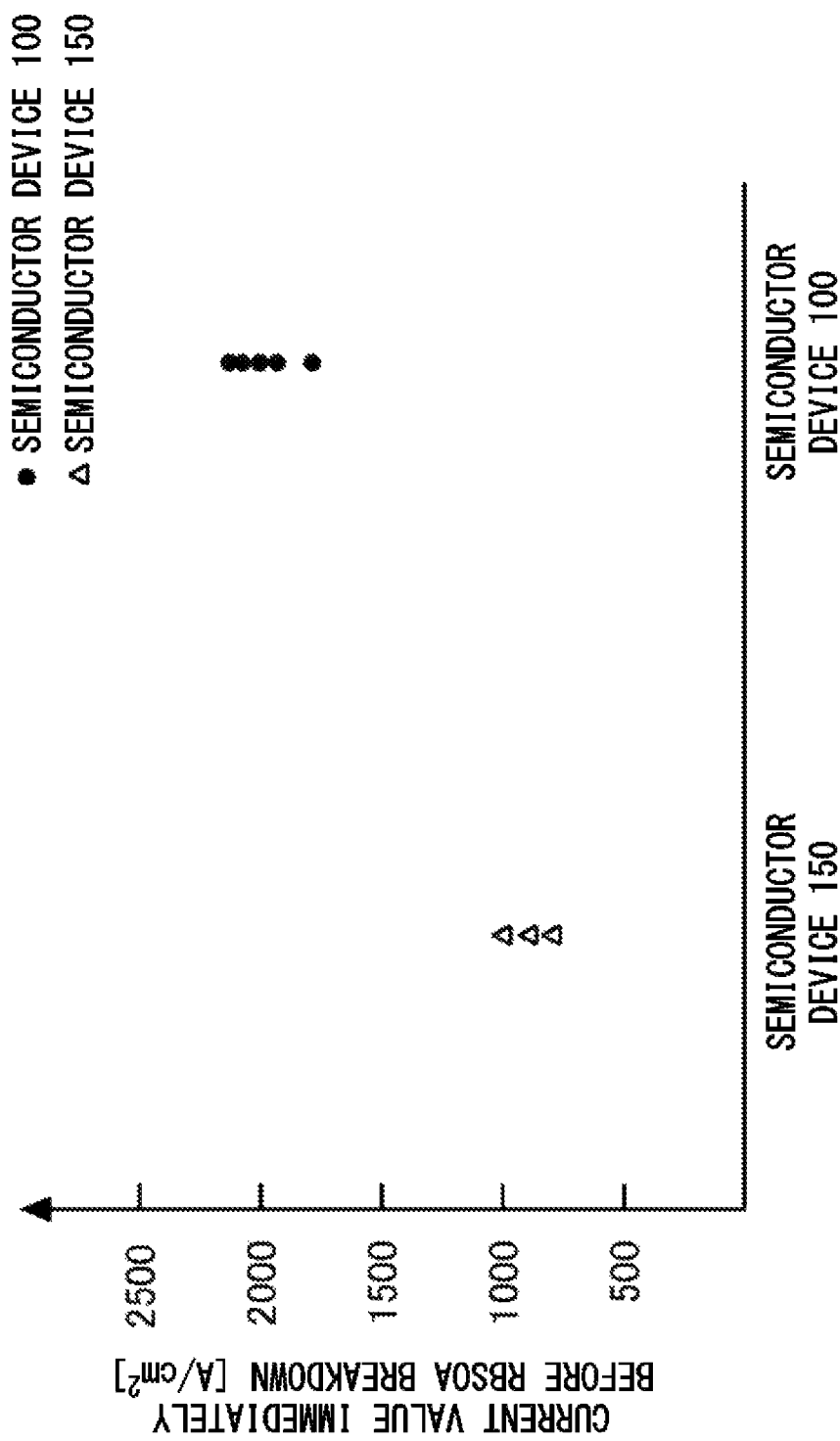
FIG. 9 is a graph showing current values immediately before RBSOA breakdowns of the semiconductor device 100 of this example and the semiconductor device 150 of Comparative Example.

FIG. 9 is a graph showing current values immediately before RBSOA breakdowns of the semiconductor device 100 of this example and the semiconductor device 150 of Comparative Example. As can be seen from FIG. 9, a current value immediately before an RBSOA breakdown of the semiconductor device 100 of this example is higher than a current value immediately before an RBSOA breakdown of the semiconductor device 150 of Comparative Example.

In the semiconductor device 100 of this example, at least a part of the plug region 17 having a higher doping concentration than the contact region 15 is disposed to overlap the contact region 15 in the top plan view, and the plug region 17 is provided at a position shallower than the contact region 15. The semiconductor device 150 of Comparative Example is not provided with the plug region 17. Therefore, the semiconductor device 100 of this example enables the latch-up to be less likely to occur, and enables the RBSOA tolerance to be more likely to increase in comparison with the semiconductor device 150 of Comparative Example.

Further, in comparison between the semiconductor device 100 of this example, and the semiconductor device in which a dose of a plug region corresponding to the plug region 17 is set to be less than the dose of the contact region 15, it is confirmed that the effect of suppressing the latch-up and suppressing the decrease of the RBSOA tolerance cannot be sufficiently obtained in the semiconductor device in which the dose of the plug region is set to be less than the dose of the contact region 15. This shows that in the disposition of the cell 13 of this example, the contact area between the emitter electrode 52 and the contact region 15 is limited, and thus in order to enhance the RBSOA tolerance, the diffusion of the plug region 17 needs to be performed at a shallower depth than the contact region 15, and additionally, the dose of the plug region 17 needs to be set to be greater than or equal to the dose of the contact region 15.

Figure 10:
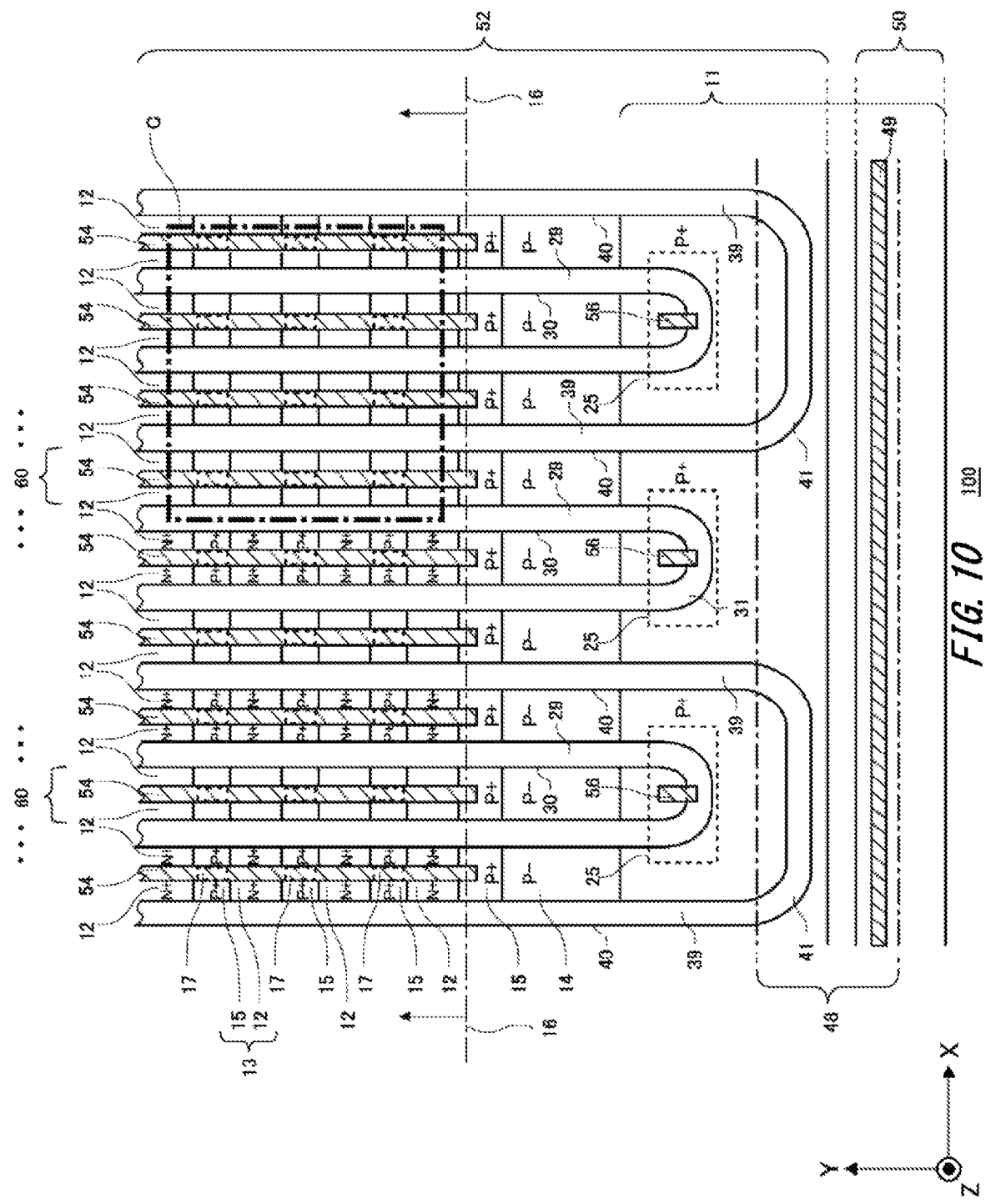
FIG. 10 is a view partially showing another example of the upper surface of the semiconductor device 100 according to an embodiment of the invention.

FIG. 10 is a view partially showing another example of the upper surface of the semiconductor device 100 according to an embodiment of the invention. The semiconductor device 100 shown in FIG. 10 is different from the semiconductor device 100 shown in FIG. 1 in that the length of the plug region 17 in the Y axis direction in the semiconductor device 100 shown in FIG. 10 is shorter than the length of the plug region 17 in the Y axis direction in the semiconductor device 100 shown in FIG. 1. In the semiconductor device 100 of this example, the plug region 17 is provided to be included in the contact region 15 in the extension direction. That is, an end of the plug region 17 on the positive side of the Y axis is provided on the negative side of the Y axis further than an end of the contact region 15 on the positive side of the Y axis. An end of the plug region 17 on the negative side of the Y axis is provided on the positive side of the Y axis further than an end of the contact region 15 on the negative side of the Y axis.

Figure 11:
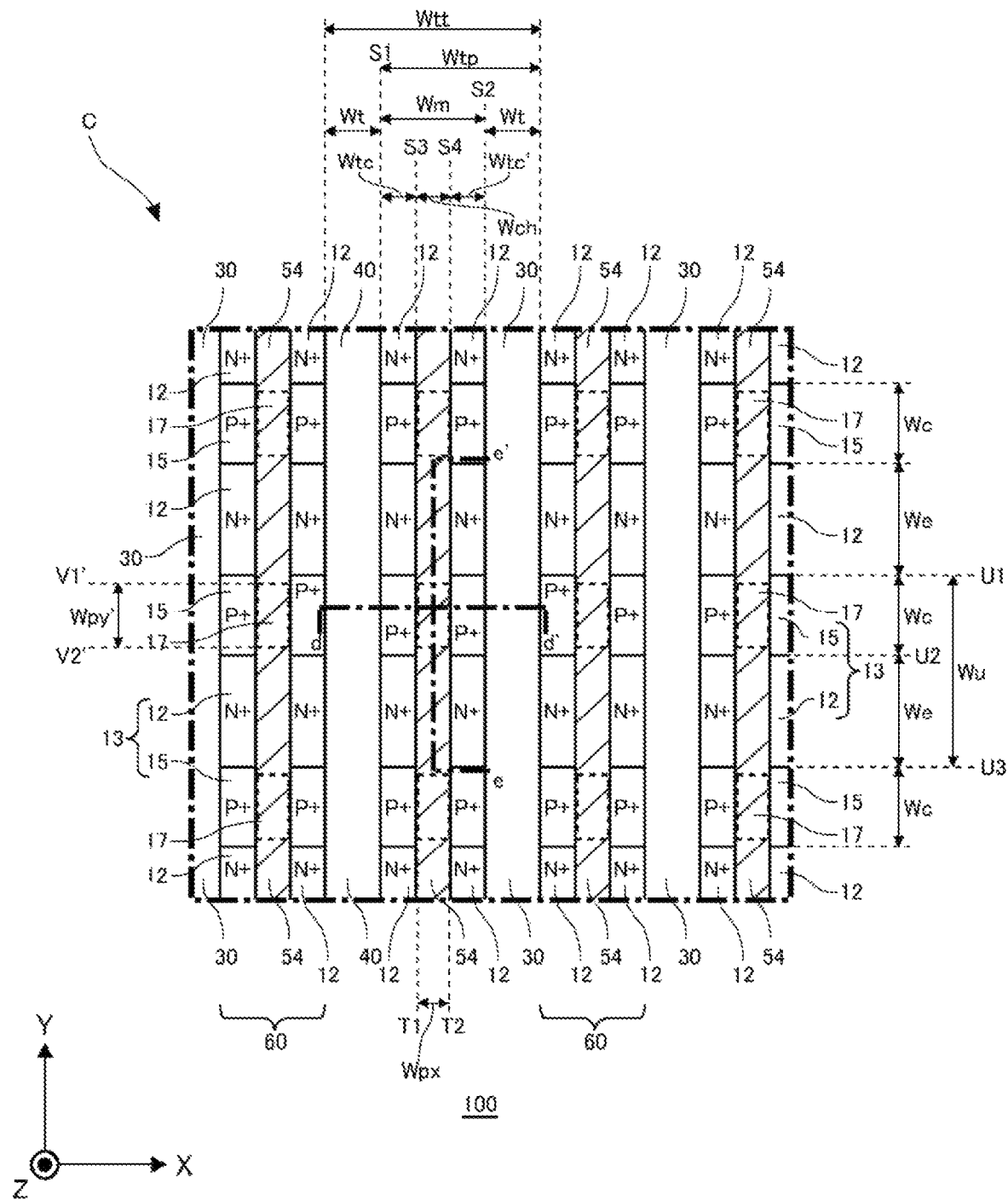
FIG. 11 is an enlarged view of a region C in FIG. 10.

FIG. 11 is an enlarged view of a region C in FIG. 10. The length of the plug region 17 in the Y axis direction in this example, as shown in FIG. 11, is shorter than the length of the plug region 17 in the Y axis direction in the example shown in FIG. 2.

In the Y axis direction, positions of end portions of the plug region 17 on the positive side of the Y axis and the negative side of the Y axis are respectively defined as a position V1' and a position V2'. In this example, a length Wpy' is a length in the Y axis direction between the position V1' and the position V2'. In this example, the position V1' is disposed on the negative side of the Y axis further than the position U1. Further, the position V2' is disposed on the positive side of the Y axis further than the position U2. That is, in this example, the length Wpy' is smaller than the length Wc.

In the semiconductor device 100 of this example, the contact region 15 is provided below the contact hole 54 and between the position V1' and the position U1 in the Y axis direction. The contact region 15 is provided also below the contact hole 54 and between the position V2' and the position U2 in the Y axis direction. That is, in the semiconductor device 100 of this example, the plug region 17 is provided to be included in the contact region 15 in the top plan view. In the top plan view, an area of the plug region 17 of this example is smaller than an area of the plug region 17 of the semiconductor device 100 shown in FIG. 1.

Figure 12:
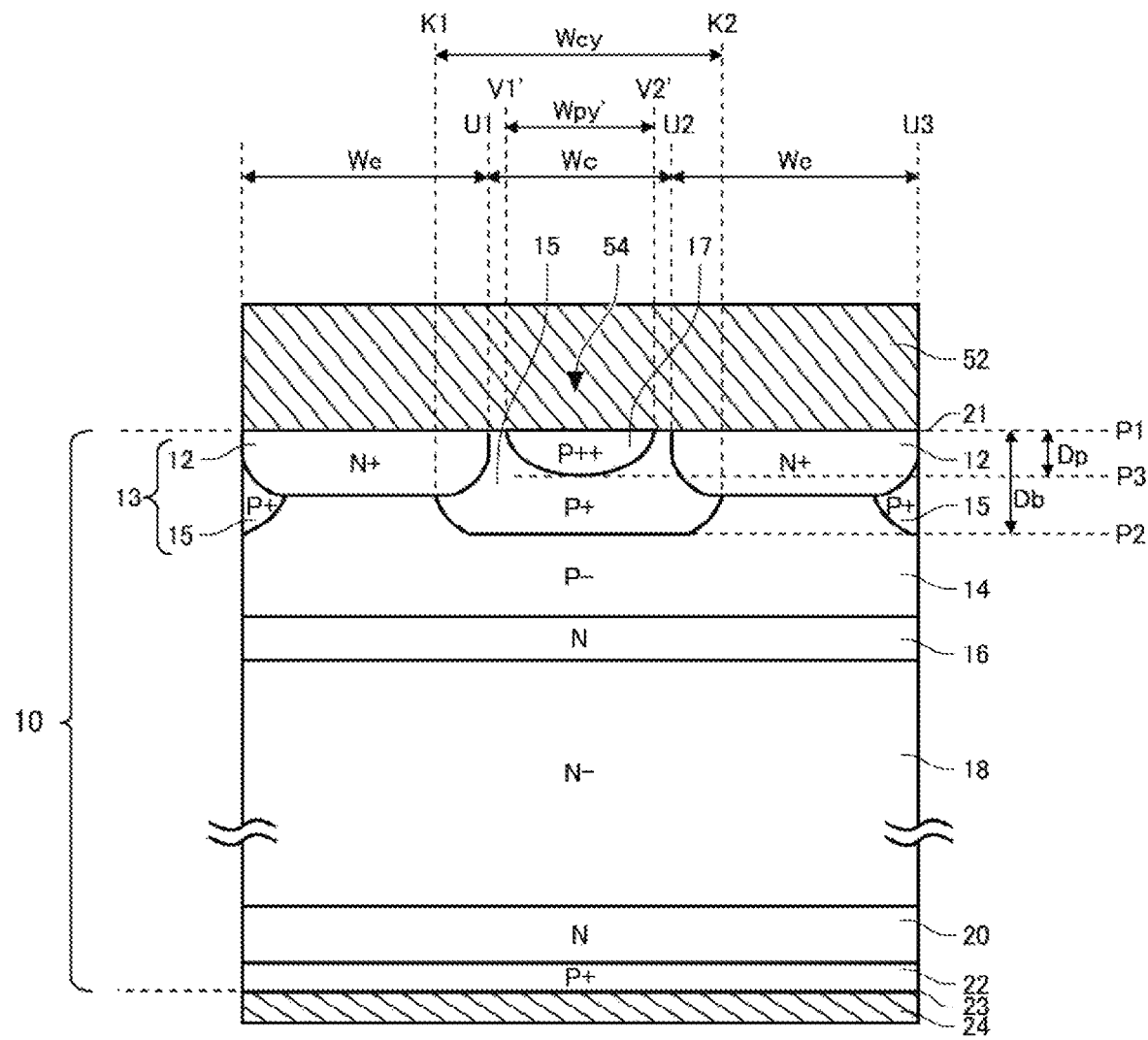
FIG. 12 is a view showing an example of a cross section e-e' in FIG. 11.

FIG. 12 is a view showing an example of a cross section e-e' in FIG. 11. As shown in FIG. 11 and FIG. 12, in the semiconductor device 100 of this example, the length Wpy' of the plug region 17 in the Y axis direction is shorter than the length Wc of the contact region 15 in the Y axis direction. The plug region 17 is provided to overlap the contact region 15 in the Y axis direction in the top plan view. In this example, between the plug region 17 and the emitter region 12 in the Y axis direction, the contact region 15 is exposed on the upper surface 21. Note that a configuration of a cross section d-d' in FIG. 11 is the same as the configuration of the cross section a-a' in FIG. 3.

The other configurations of the semiconductor device 100 of this example are the same as those of the semiconductor device 100 shown in FIG. 1. In the semiconductor device 100 of this example, the length Wpy' is smaller than the length Wc, and thus the plug region 17 is not in contact with the emitter region 12. In a case where the plug region 17 is in contact with the emitter region 12, a peak concentration of the base region 14 in a vicinity of the gate trench portion 40 may decrease. That is, by providing the plug region 17 apart from the emitter region 12, it is possible to suppress a reduction in peak concentration of the base region 14 that determines a gate threshold voltage Vth. Further, by providing the plug region 17 apart from emitter region 12, it is possible to reduce a fluctuation in gate threshold voltage Vth even when the position of the plug region 17 deviates in the Y axis direction.

Figure 13:
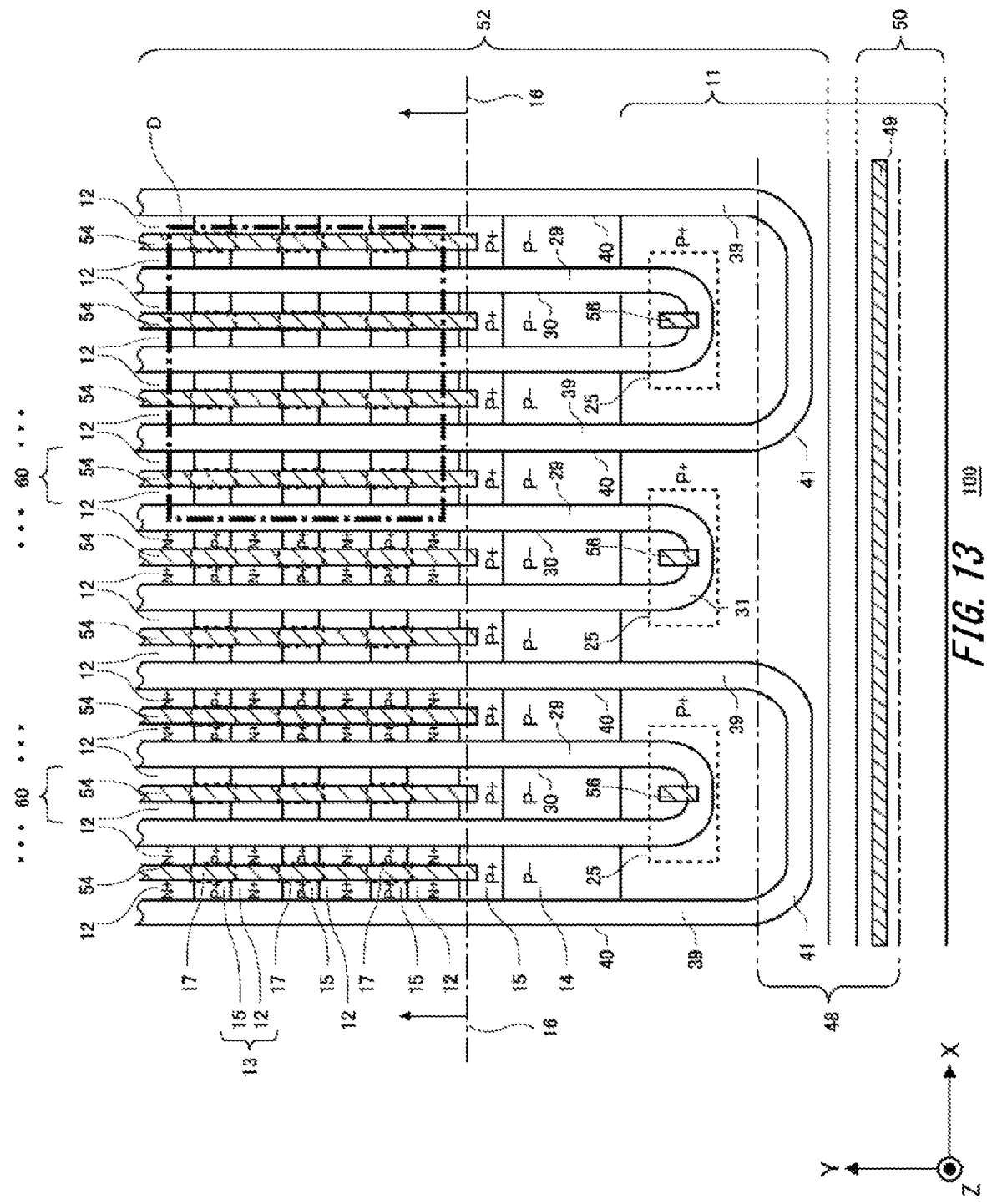
FIG. 13 is a view partially showing another example of the upper surface of the semiconductor device 100 according to an embodiment of the invention.

FIG. 13 is a view partially showing another example of the upper surface of the semiconductor device 100 according to an embodiment of the invention. The semiconductor device 100 shown in FIG. 13 is different from the semiconductor device shown in FIG. 1 in that the length of the plug region 17 in the Y axis direction in the semiconductor device 100 shown in FIG. 13 is longer than the length of the plug region 17 in the Y axis direction in the semiconductor device 100 shown in FIG. 1, and in that the length of the plug region 17 in the X axis direction in the semiconductor device 100 shown in FIG. 13 is longer than the length of the plug region 17 in the X axis direction in the semiconductor device 100 shown in FIG. 1.

In the semiconductor device 100 of this example, the end of the plug region 17 on the positive side of the Y axis is provided on the positive side of the Y axis further than the end of the contact region 15 on the positive side of the Y axis, and the end of the plug region 17 on the negative side of the Y axis is provided on the negative side of the Y axis further than the end of the contact region 15 on the negative side of the Y axis. Further, in the semiconductor device 100 of this example, the end of the plug region 17 on the positive side of the X axis is provided on the positive side of the X axis further than the end of the contact region 15 on the positive side of the X axis, and the end of the plug region 17 on the negative side of the X axis is provided on the negative side of the X axis further than the end of the contact region 15 on the negative side of the X axis.

Figure 14:
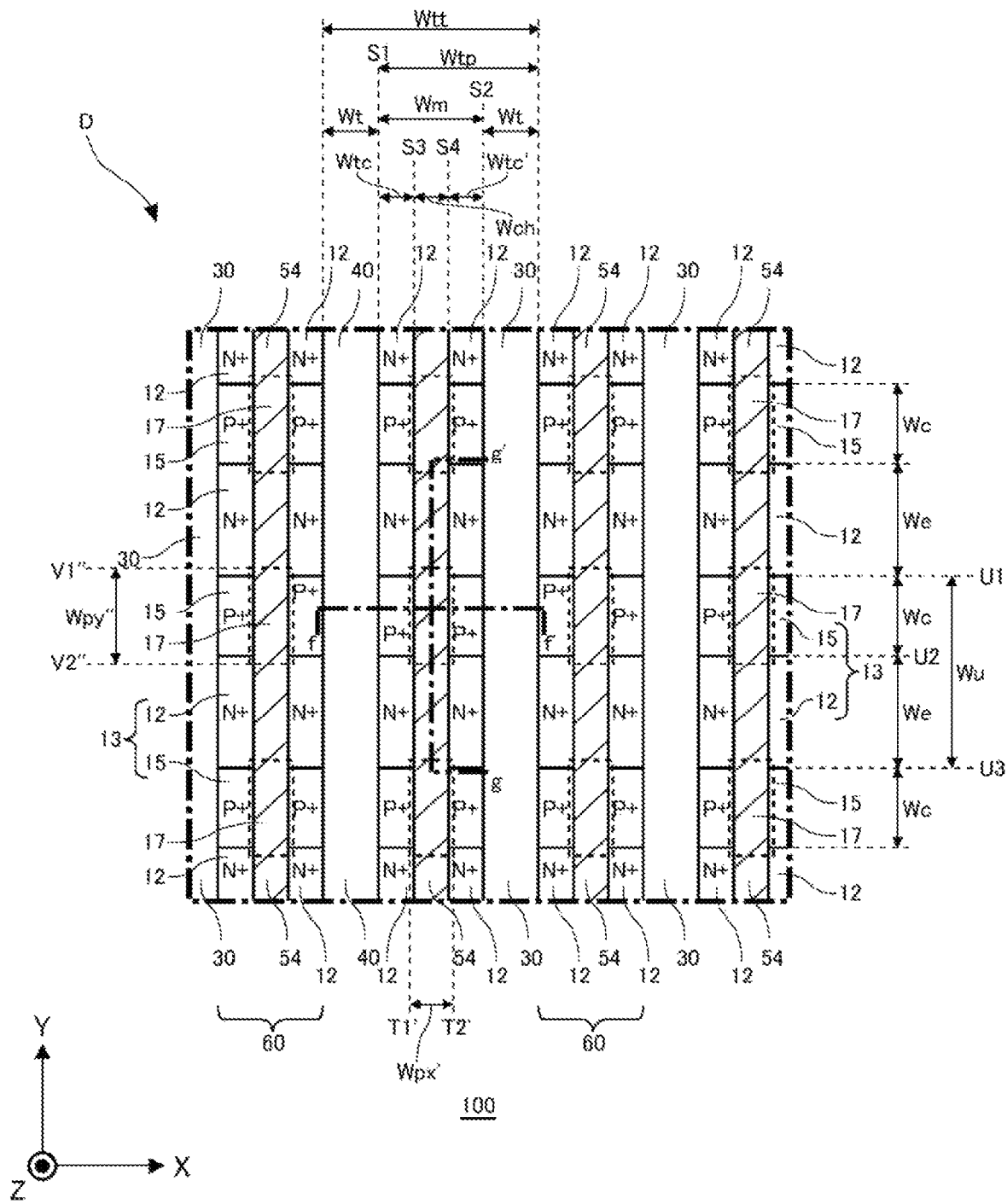
FIG. 14 is an enlarged view of a region D in FIG. 13.

FIG. 14 is an enlarged view of a region D in FIG. 13. The length of the plug region 17 in the Y axis direction in this example, as shown in FIG. 14, is longer than the length of the plug region 17 in the Y axis direction in the example shown in FIG. 2. Further, the length of the plug region 17 in the X axis direction in this example is longer than the length of the plug region 17 in the X axis direction in the example shown in FIG. 2.

In the Y axis direction, positions of end portions of the plug region 17 on the positive side of the Y axis and the negative side of the Y axis are respectively defined as a position V1" and a position V2". In this example, a length Wpy" is a width in the Y axis direction between the position V1" and the position V2". In this example, the position V1" is disposed on the positive side of the Y axis further than the position U1. Further, the position V2' is disposed on the negative side of the Y axis further than the position U2. In this example, the length Wpy" is greater than the length Wc.

Below the contact hole in the semiconductor device 100 of this example, the plug region 17 is provided to protrude in the Y axis direction further than the contact region 15. In other words, below the contact hole in the semiconductor device 100 of this example, the plug region 17 is provided to protrude to the emitter region 12 side further than a boundary between the emitter region 12 and the contact region along the X axis direction.

In the X axis direction, positions of end portions of the plug region 17 on the positive side of the X axis and the negative side of the X axis are respectively defined as a position T2' and a position T1'. In this example, a width Wpx' is a width in the X axis direction between the position T1' and the position T2'. In this example, the position T1' is disposed on the negative side of the X axis further than the position S3. Further, the position T2' is disposed on the positive side of the X axis further than the position S4. In this example, the width Wpx' is greater than the width Wch.

In the semiconductor device 100 of this example, the plug region 17 is provided up to an outside of the contact hole 54 in the X axis direction in the top plan view. In the X axis direction as well, the plug region 17 of this example is provided to protrude to the emitter region 12 side at the position V1" of the end portion and the position V2" of the end portion. That is, the opening width Wch of the contact hole 54 between the trench portions is smaller than the width Wpx' of the plug region 17 between the trench portions.

Figure 15:
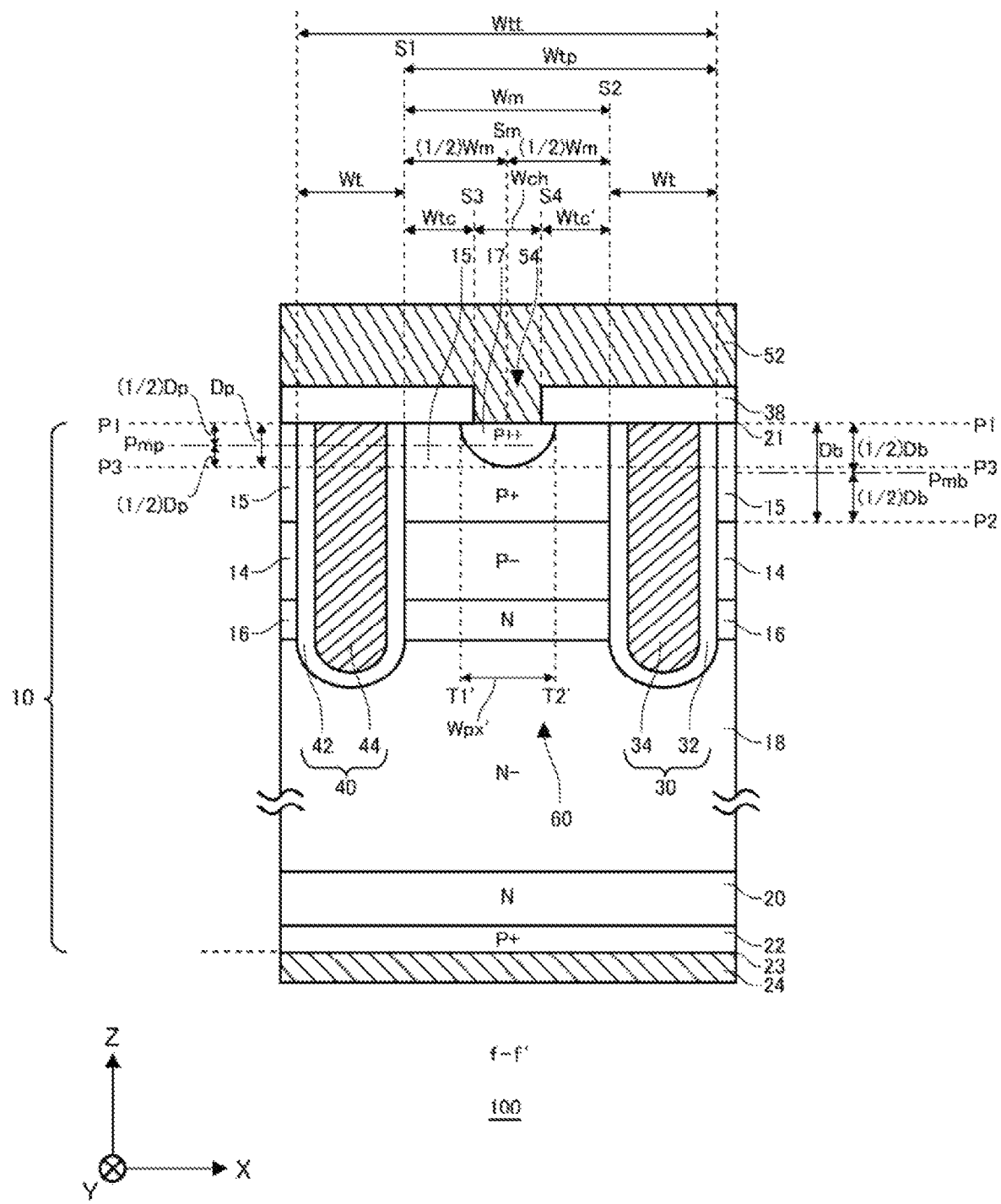
FIG. 15 is a view showing an example of a cross section f-f' in FIG. 14.

FIG. 15 is a view showing an example of a cross section f-f' in FIG. 14. As shown in FIG. 15, in the semiconductor device 100 of this example, the width Wpx' of the plug region 17 in the X axis direction is longer than the width Wch of the contact hole 54 in the X axis direction. In this example, both ends of the plug region 17 in the X axis direction are provided to overlap the interlayer dielectric film 38 in the top plan view.

Figure 16:
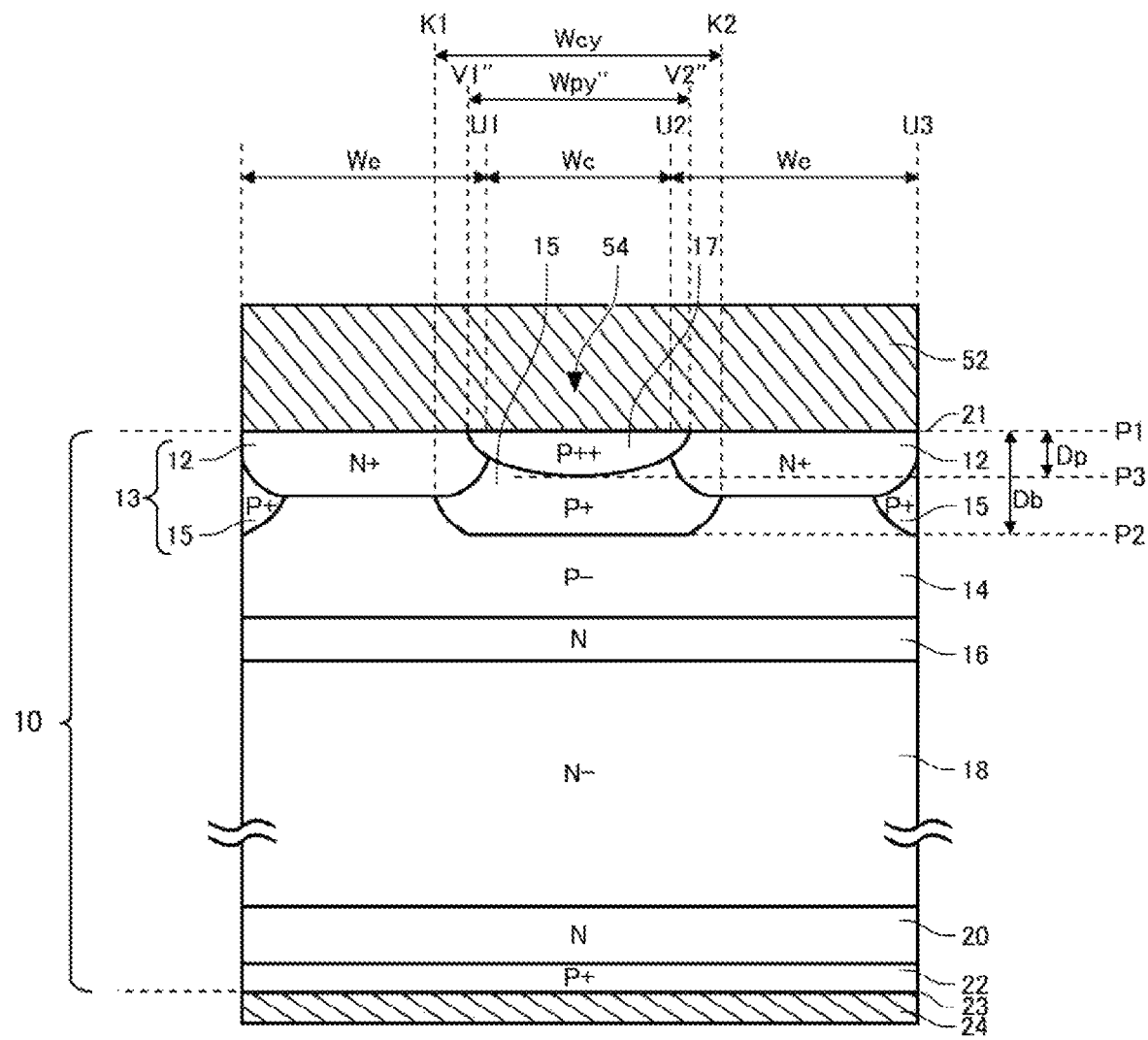
FIG. 16 is a view showing an example of a cross section g-g' in FIG. 14.

FIG. 16 is a view showing an example of a cross section g-g' in FIG. 14. As shown in FIG. 16, in the semiconductor device 100 of this example, the length Wpy" of the plug region 17 in the Y axis direction is longer than the length Wc of the contact region 15 in the Y axis direction.

The position V1" may be disposed on the positive side of the Y axis further than the position K1 of the end portion of the contact region on the negative side of the Y axis at a bottom portion of the emitter region 12. The position V2" may be disposed on the negative side of the Y axis further than the position K2 of the end portion of the contact region on the positive side of the Y axis at a bottom portion of the emitter region 12.

The position V1" may be disposed on the negative side of the Y axis further than the position K1. The position V2" may be disposed on the positive side of the Y axis further than the position K2. That is, on the upper surface 21, the plug region 17 may be provided to protrude, further than the position K1, to the emitter region 12 on the negative side of the Y axis. In addition, the plug region 17 may be provided to protrude, further than the position K2, to the emitter region 12 on the positive side of the Y axis.

In the semiconductor device 100 of this example, the position V1" is disposed on the positive side of the Y axis further than the position K1, and the position V2" is disposed on the negative side of the Y axis further than the position K2. That is, the positions of the end portions of the plug region 17 are positioned inside the emitter region 12 in a plan view, but do not reach the position K1 and the position K2, respectively. Therefore, it is possible to suppress the reduction in peak concentration of the base region 14 that determines the gate threshold voltage Vth.

Figure 17:
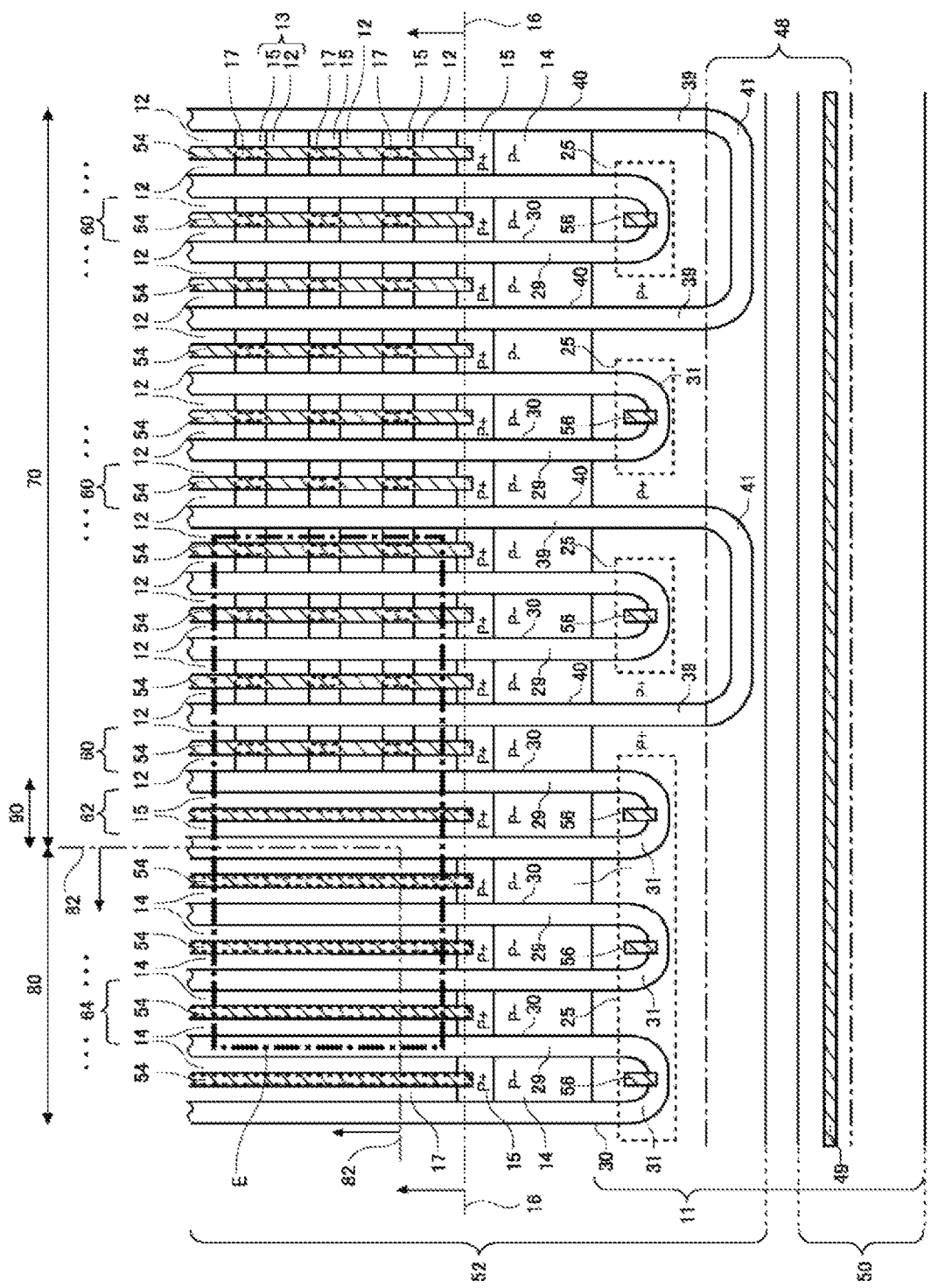
FIG. 17 is a view partially showing an example of an upper surface of a semiconductor device 200 according to an embodiment of the invention.

FIG. 17 is a view partially showing an example of an upper surface of a semiconductor device 200 according to an embodiment of the invention. The semiconductor device 200 of this example is a semiconductor chip having a transistor portion 70 including a transistor such as an insulated gate bipolar transistor (IGBT), and a diode portion 80 including a diode such as a free wheel diode (FWD: Free Wheel Diode). In the semiconductor device 200 of this example, the diode portions 80 are arranged in the arrangement direction (the X axis direction) in the semiconductor device 100 shown in FIG. 1. FIG. 17 shows an upper surface of the chip around an end portion of the chip, and other regions are omitted.

The diode portion 80 is a region where a cathode region 82 of the first conductivity type is provided on the lower surface 23 side of the semiconductor substrate 10. The cathode region 82 of this example is of the N+ type. The cathode region 82 is exposed on the lower surface 23 side, and is in contact with an electrode provided on the lower surface 23.

In the specification, a region overlapping the cathode region 82 in the Z axis direction is defined as the diode portion 80. That is, when the cathode region 82 is projected to the upper surface 21 of the semiconductor substrate 10 in a direction perpendicular to the lower surface 23, a projection region is defined as the diode portion 80. Further, an extension region where the projection region is extended up to an end of the active region in the Y axis direction may be defined as the diode portion 80. The active region will be described below. The Y axis direction is a direction perpendicular to both of the X axis direction and the Z axis direction. The diode portion 80 may indicate, of the projection region and the extension region, a region where a region of the second conductivity type is provided on the upper surface 21.

The transistor portion 70 may indicate a region other than the diode portion 80 in the active region. The transistor portion 70 has a collector region 22 exposed on the lower surface 23. The transistor portion 70 may be a projection region when the collector region 22 is projected to the upper surface 21, and may indicate a region where a predetermined configuration unit including the emitter region 12 and the contact region 15 is regularly is disposed.

Between the emitter electrode 52 and the gate metal layer 50, and the upper surface 21, the interlayer dielectric film 38 is provided, but is omitted in FIG. 17. The emitter electrode 52 is electrically connected to the emitter region 12, the contact region 15, and the base region 14 on the upper surface 21, through the contact hole 54. Further, the emitter electrode 52 is electrically connected to the dummy conductive portion in the dummy trench portion 30, through the contact hole 56. Inside the contact hole 54 and contact hole 56, contact plugs of tungsten (W) or the like may be provided.

The gate metal layer 50 applies the gate voltage to the transistor portion 70. The gate metal layer 50 is electrically connected to the gate runner 48 through contact hole 49. Inside the contact hole 49, a contact plug of tungsten (W) or the like may be provided.

In the specification, a boundary region of the transistor portion 70 with the diode portion 80 in the arrangement direction is defined as a boundary portion 90. The boundary portion 90 includes one or more mesa portions 62. The mesa portion 62 is not provided with the emitter region 12. On an upper surface of the mesa portion 62, the contact region 15 is provided in a region interposed between the base regions 14 in the Y axis direction in the top plan view. The mesa portion 62 has a function of extracting carriers such as holes to the emitter electrode 52 side when the transistor portion 70 is turned off or the like.

In the mesa portion 62, in a region which is below the contact hole 54 and is interposed between the contact regions 15 in the arrangement direction on the upper surface 21, the plug region 17 may be provided. In FIG. 17, the region where the plug region 17 is provided is indicated by broken lines. The plug region 17 is provided in contact with the upper surface 21.

Below the plug region 17 in the mesa portion 62, the contact region 15 is provided. The contact region 15 provided below the plug region 17 is connected, inside the semiconductor substrate 10, to two contact regions 15 provided across the plug region 17 in the top plan view. For the mesa portion 62, two contact regions 15 are provided respectively in contact with two dummy trench portions 30 extending in the Y axis direction with the mesa portion 62 interposed in between. Note that the mesa portion 62 may be interposed between two gate trench portions 40.

A mesa portion 64 of the diode portion 80 may not be provided with the emitter region 12. On an upper surface of the mesa portion 64, the base region 14 is provided in a region interposed between the contact regions 15 in the Y axis direction in the top plan view.

In the mesa portion 64, in a region which is below the contact hole 54 and is interposed between the base regions 14 in the arrangement direction on the upper surface 21, the plug region 17 may be provided. In FIG. 17, the region where the plug region 17 is provided is indicated by broken lines. The plug region 17 is provided in contact with the upper surface 21.

Below the plug region 17 in the mesa portion 64, the base region 14 is provided. The base region 14 provided below the plug region 17 is connected, inside the semiconductor substrate 10, to two base regions 14 provided across the plug region 17 in the top plan view. For the mesa portion 64, two base regions 14 are provided respectively in contact with two dummy trench portions 30 extending in the Y axis direction with the mesa portion 64 interposed in between.

In the diode portion 80, the cathode region 82 is provided in a region adjacent to the lower surface 23 of the semiconductor substrate 10. In FIG. 17, a region where the cathode region 82 is provided is indicated by a dashed line and an arrow. On a region adjacent to the lower surface 23 of the semiconductor substrate 10, the collector region 22 of the P+ type may be provided in a region where the cathode region 82 is not provided.

The accumulation region 16 may be provided below the emitter region 12, the contact region 15, the base region 14, and the plug region 17. The accumulation region 16 may not be provided in the diode portion 80.

Figure 18:
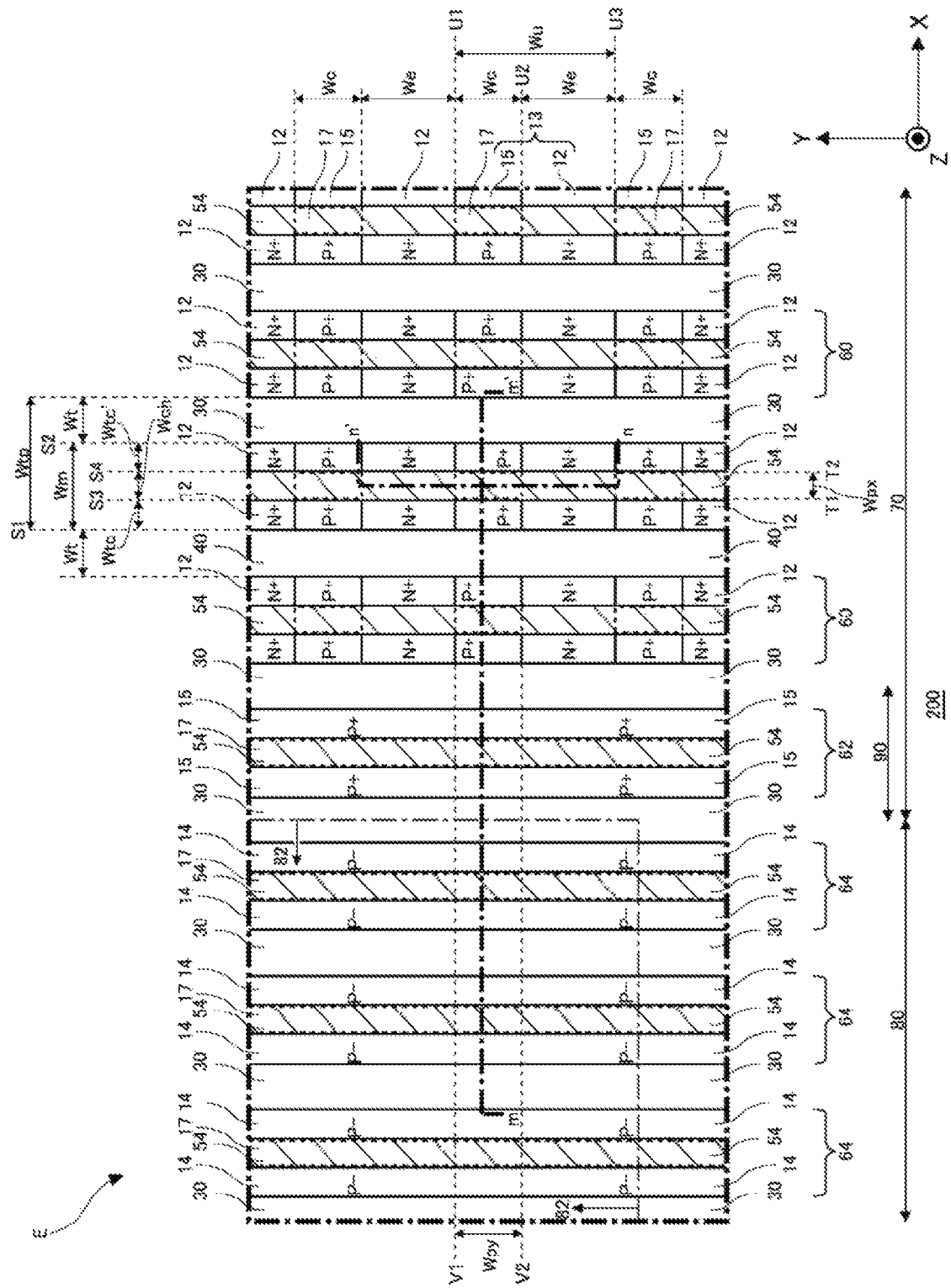
FIG. 18 is an enlarged view of a region E in FIG. 17.

FIG. 18 is an enlarged view of a region E in FIG. 17. In the transistor portion 70 in the semiconductor device 200 of this example as shown in FIG. 17, in a region which is below the contact hole 54 and is interposed between the contact regions 15 in the X axis direction on the upper surface 21, the plug region 17 is provided. In the boundary portion 90, in a region which is below the contact hole 54 and is interposed between the contact regions 15 in the X axis direction on the upper surface 21, the plug region 17 is provided. In the diode portion 80, in a region which is below the contact hole 54 and is interposed between the base regions 14 in the X axis direction on the upper surface 21, the plug region 17 is provided.

Figure 19:
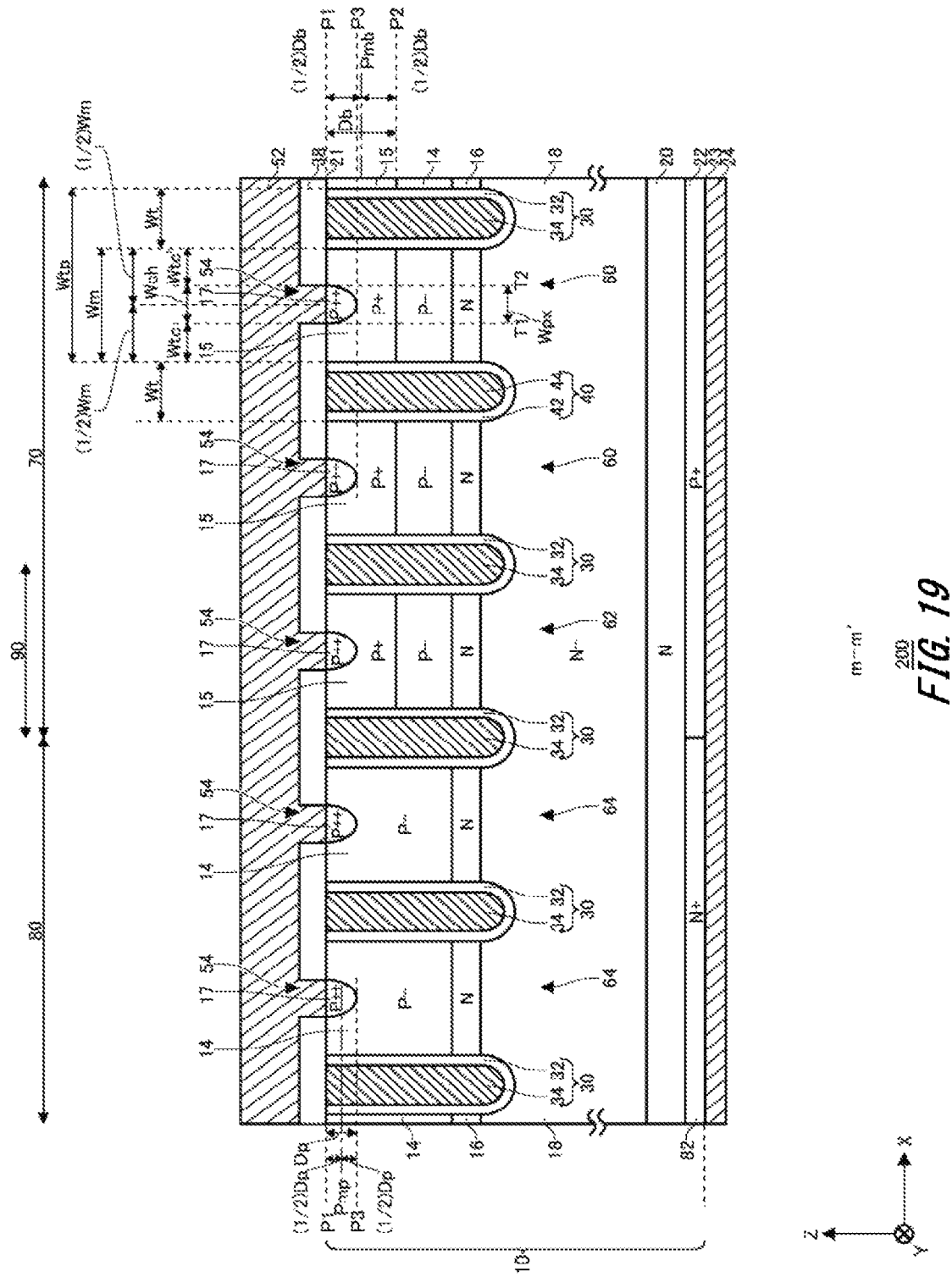
FIG. 19 is a view showing an example of a cross section m-m' in FIG. 18.

FIG. 19 is a view showing an example of a cross section m-m' in FIG. 18. The cross section m-m' is an XZ plane passing through the gate trench portion 40, the dummy trench portion 30, the contact region 15, and the plug region 17 in the transistor portion 70, and the dummy trench portion 30, the base region 14, and the plug region 17 in the diode portion 80.

In the semiconductor device 200 of this example as shown in FIG. 19, the plug region 17 is provided below the contact hole 54 and in contact with the upper surface 21. Below the plug region 17 in the transistor portion 70, the contact region 15 is provided. Below the plug region 17 in the diode portion 80, the base region 14 is provided. Note that a configuration of the cross section n-n' in FIG. 18 is the same as the configuration of the cross section b-b' in FIG. 4.

Figure 20:
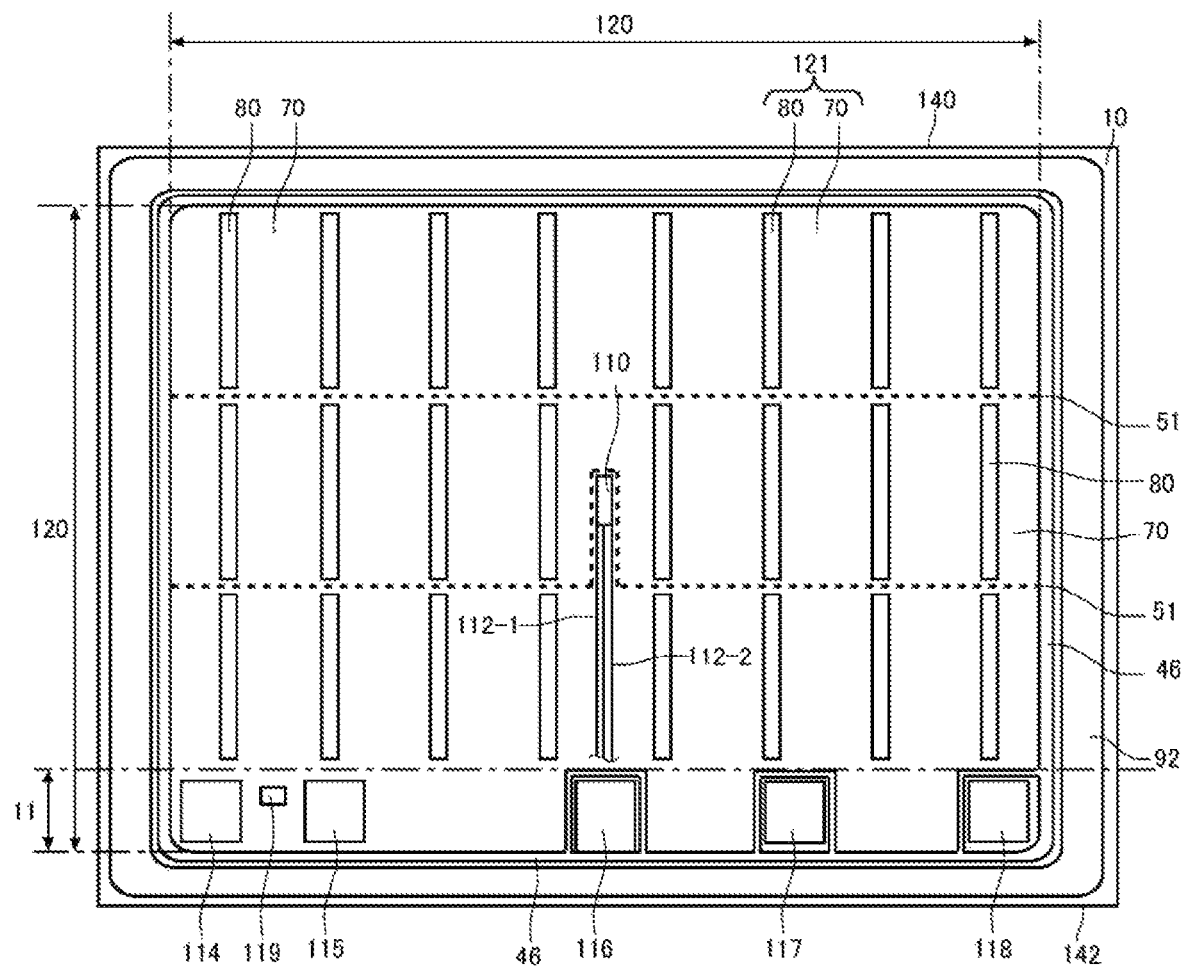
FIG. 20 is a view showing a structure of an upper surface of a semiconductor device 300 according to one embodiment of the invention.

FIG. 20 is a view showing a structure of an upper surface of a semiconductor device 300 according to one embodiment of the invention. The semiconductor device 300 includes an active region 120 and an edge termination structure portion 92. The active region 120 is a region inside the edge termination structure portion 92. The edge termination structure portion 92 may have the well region 11. The well region 11 has a higher doping concentration than the base region 14. The active region 120 may be defined as a region where a current flows inside the semiconductor substrate 10 in the depth direction, from the upper surface to the lower surface, or from the lower surface to the upper surface of the semiconductor substrate 10.

In the active region 120, the transistor portion 70 and the diode portion 80 are provided. In this example, the transistor portion 70 and the diode portion 80 are alternately provided in the X axis direction in the active region 120. One transistor portion 70 and one diode portion 80 which are adjacent to each other in the X axis direction constitute a main semiconductor element portion 121. However, in a case of not a so-called RC-IGBT (a reverse conducting IGBT), the transistor portion 70 may be defined as a portion to constitute the main semiconductor element portion 121. That is, the main semiconductor element portion 121 indicates a semiconductor element portion through which a main current flows.

Above the upper surface 21 of the semiconductor substrate 10, a plurality of pads is provided. In the example of FIG. 20, a sense pad 114, an emitter pad 115, a gate pad 116, a cathode pad 117, and an anode pad 118 are provided. The sense pad 114 is connected to a sense semiconductor element portion 119.

The sense semiconductor element portion 119 has the same structure as the transistor portion 70, and has a smaller area (corresponding to an area of the channel) than the transistor portion 70 in the top plan view. By detecting a current flowing through the sense semiconductor element portion 119, it is possible to estimate a current flowing through a whole semiconductor device 300.

The emitter pad 115 is connected to the emitter electrode 52 disposed above the upper surface 21 of the semiconductor substrate 10. The gate pad 116 is connected to a gate electrode of the transistor portion 70. The gate pad 116 of this example is connected to a gate runner portion described below. The cathode pad 117 and the anode pad 118 are connected to a temperature sense portion 110 described below. Note that the number and types of pads provided on the semiconductor substrate 10 are not limited to the example shown in FIG. 20.

Each pad is formed of a metal material such as aluminum. The plurality of pads is arranged in a predetermined arrangement direction between the active region 120, and a first edge side 142 on the upper surface 21 of the semiconductor substrate 10. The plurality of pads of this example is disposed to be interposed between an element region and the first edge side 142 in the Y axis direction. An arrangement direction of the plurality of pads may be a direction of a straight line connecting the centers of two pads (the sense pad 114 and the anode pad 118 in this example), among the plurality of pads, disposed at both ends in a direction parallel to the first edge side 142, in the top plan view. The arrangement direction may be a direction parallel to the first edge side 142 (the X axis direction in this example). In a region where each pad is provided in the X axis direction, the well region 11 may be exposed on the upper surface of the semiconductor substrate 10.

The semiconductor device 300 includes the gate runner portion that transmits the gate voltage to the transistor portion 70. The semiconductor device 300 of this example includes a first gate runner 46 and a second gate runner 51 as the gate runner portion. In this example, each gate runner is provided above the upper surface 21 of the semiconductor substrate 10, and is insulated from the upper surface 21 of the semiconductor substrate 10 by the interlayer dielectric film 38.

The first gate runner 46 is provided to pass through between the first edge side 142 of the semiconductor substrate 10 and at least one pad, in the top plan view. The first gate runner 46 of this example is provided to pass through between each of the sense pad 114, the emitter pad 115, the gate pad 116, the cathode pad 117, and the anode pad 118, and the first edge side 142, and to be in parallel with the first edge side 142. The first gate runner 46 is connected to the gate pad 116.

Further, the first gate runner 46 is provided to surround the active region 120 between the other edge side of the semiconductor substrate 10 and the active region 120. That is, the first gate runner 46 of this example is provided to be loop-shaped along each edge side of the semiconductor substrate 10. The second gate runner 51 may be provided above the active region 120. The second gate runner 51 is connected to the first gate runner 46 at both ends in the X axis direction.

The first gate runner 46 and the second gate runner 51 may be metal wirings of aluminum or the like, may be semiconductor wirings of polysilicon or the like doped with impurities, and may be provided with the metal wiring and the semiconductor wiring overlapping each other via an insulation film. The insulation film is provided with a contact hole for connecting the metal wiring and the semiconductor wiring.

A sense semiconductor element portion 119 is provided between a pad (the sense pad 114 in this example) disposed at the end of the negative side in the X axis direction, and the emitter pad 115. The sense semiconductor element portion 119 may be surrounded by the well region 11 as described below. The sense semiconductor element portion 119 may be separated from the transistor portion 70 and the diode portion 80. The transistor portion 70 and the diode portion 80 may be set to have the same configuration as the semiconductor device 200 in FIG. 17.

On the upper surface 21 of the semiconductor substrate 10, the edge termination structure portion 92 is provided between the first gate runner 46 and an outer peripheral end 140 of the semiconductor substrate 10. The edge termination structure portion 92 may be disposed to be loop-shaped to surround the first gate runner 46 on the upper surface 21 of the semiconductor substrate 10. The edge termination structure portion 92 of this example is disposed along the outer peripheral end 140 of the semiconductor substrate 10. The edge termination structure portion 92 relaxes an electric field concentration on the upper surface 21 side of the semiconductor substrate 10. The edge termination structure portion 92 has, for example, a structure of a guard ring, a field plate, a RESURF, or a combination of these.

The semiconductor device 300 of this example includes a temperature sense portion 110, and temperature sense wirings 112-1, 112-2. The temperature sense portion 110 is provided above the active region 120. The temperature sense portion 110 may be provided at the center of the active region 120 in the top plan view of the semiconductor substrate 10. The temperature sense portion 110 may be provided above the transistor portion 70 in the top plan view of the semiconductor substrate 10. Further, the temperature sense portion 110 may be disposed over the transistor portion 70 and the diode portion 80. The temperature sense portion 110 detects a temperature of the active region 120. The temperature sense portion 110 may be a temperature sense diode of a pn type, which is formed of monocrystalline or polycrystalline silicon.

The temperature sense wiring 112 is provided above the active region 120. The temperature sense wiring 112 may be formed of aluminum. The temperature sense wiring 112 may be formed by etching the same aluminum wiring as the emitter electrode 52. The temperature sense wiring 112 is connected to the temperature sense portion 110. The temperature sense wiring 112 extends up to a region between the active region 120 and the outer peripheral end 140 on the upper surface 21 of the semiconductor substrate 10, and is connected to the cathode pad 117 and the anode pad 118.

Figure 21:
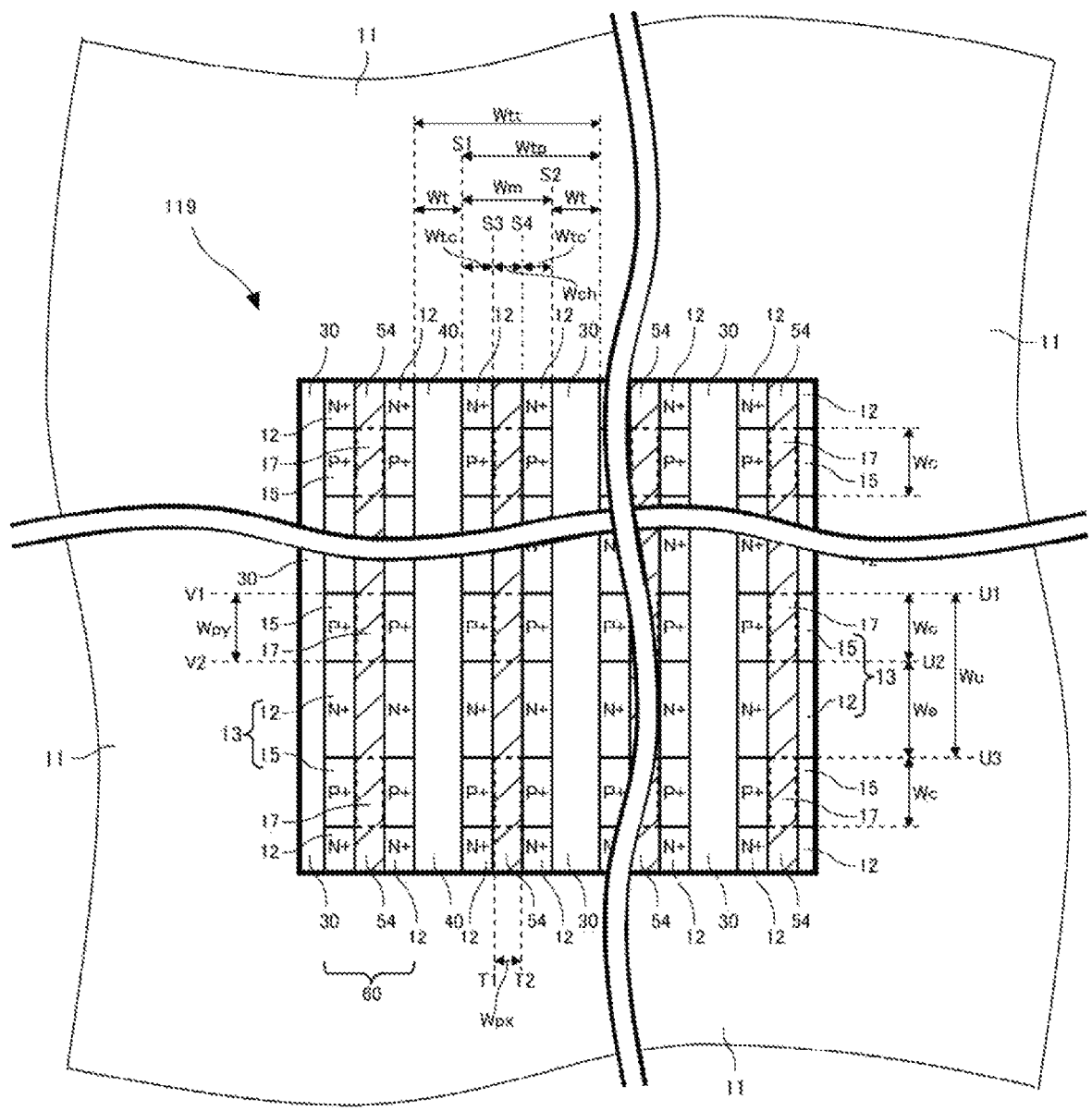
FIG. 21 is an enlarged view of a vicinity of a sense semiconductor element portion 119 in FIG. 20
Figure 21:
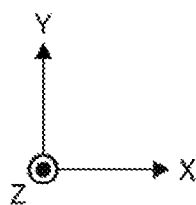

FIG. 21 is an enlarged view of a vicinity of a sense semiconductor element portion 119 in FIG. 20

As shown in FIG. 21, the sense semiconductor element portion 119 of this example is provided to be surrounded by the well region 11 in the active region 120. In particular, the sense semiconductor element portion 119 of this example has the plug region 17. Specifically, the plug region 17 of this example may have the same configuration as the semiconductor device 100 shown in FIG. 2. The sense semiconductor element portion 119 may be formed in the same step as the transistor portion 70 of the main semiconductor element portion 121. By setting a planar shape and a pitch of the cell 13 of the sense semiconductor element portion 119 to be respectively the same as the planar shape and the pitch of the cell 13 in the semiconductor device 100 shown in FIG. 2, a precision of the current detection can be enhanced.

The planar shape and the pitch of the cell 13 of the sense semiconductor element portion 119 may not be respectively the same as the planar shape and the pitch of the cell 13 in the semiconductor device 100 shown in FIG. 2. Although the planar shape and the pitch of the cell 13 of the sense semiconductor element portion 119 are respectively different from the planar shape and the pitch of the cell 13 in the semiconductor device 100 shown in FIG. 2, the sense semiconductor element portion 119 only needs to have the plug region 17. Accordingly, it is possible to exhibit the effect of suppressing the latch-up of the sense semiconductor element portion 119 and enhancing the RBSOA tolerance.

The sense semiconductor element portion 119 may have the same configuration as the semiconductor device 100 shown in FIG. 11, and may have the same configuration as the semiconductor device 100 shown in FIG. 14. Further, similar to the transistor portion 70, the sense semiconductor element portion 119 may include the trench portion (the gate trench portion 40 and the dummy trench portion 30), the contact region 15, and the plug region 17.

Figure 22:
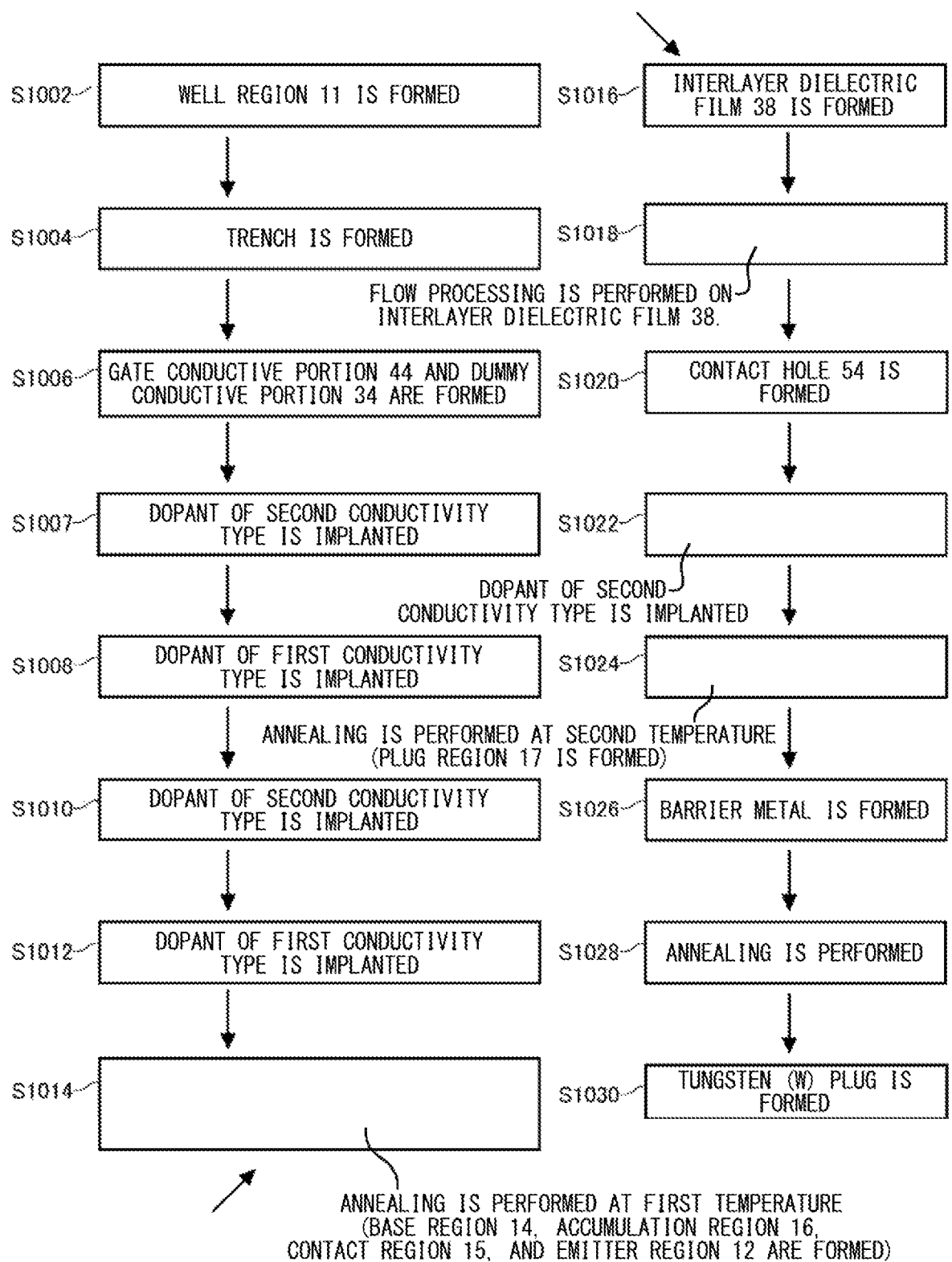
FIG. 22 is a flowchart showing an example of an outline of a method of manufacturing a semiconductor device according to an embodiment of the invention.

FIG. 22 is a flowchart showing an example of an outline of a method of manufacturing a semiconductor device according to an embodiment of the invention. In the method of manufacturing a semiconductor device of this example, forming of the contact region 15 of the second conductivity type, and forming of the plug region 17 of the second conductivity type are carried out as steps. Hereinafter, a description will be made with reference to FIG. 22.

In step S1002, the well region 11 of the second conductivity type is formed from the upper surface 21 to a predetermined depth, in the semiconductor substrate 10. In subsequent step S1004, the plurality of trench portions is formed, the trench portions being provided from the upper surface 21 of the semiconductor substrate 10 to the inside of the semiconductor substrate 10, being extending in the predetermined extension direction (the Y axis direction) on the upper surface 21, and being arranged in the arrangement direction (the X axis direction) orthogonal to the extension direction. The trench portion may be formed at a depth shallower than a depth of the well region 11. The trench portion constitutes the gate trench portion 40 and the dummy trench portion 30 in the semiconductor device 100 and the semiconductor device 200.

In step S1006, by nitriding or oxidizing the inner wall of the trench, the gate insulation film 42 and the dummy insulation film 32 are formed. Subsequently, the trench is filled with a conductive material such as polysilicon to form the gate conductive portion 44 and the dummy conductive portion 34.

In step S1007, the dopant of the second conductivity type is implanted from the upper surface 21. The dopant of the second conductivity type is, for example, boron (B), indium (In), or the like. A region into which the dopant has been implanted in step S1007 is a region which becomes the base region 14 by annealing in following step S1014.

In step S1008, the dopant of the first conductivity type is implanted from the upper surface 21. The dopant of the first conductivity type is, for example, arsenic (As), phosphorus (P), antimony (Sb), or the like. A region into which the dopant has been implanted in step S1008 is a region which becomes the accumulation region 16 by the annealing in following step S1014.

In step S1010, the dopant of the second conductivity type is implanted from the upper surface 21 by a first depth and a first implantation amount, in the depth direction of the semiconductor substrate 10, between adjacent two of the trench portions in the arrangement direction (the X axis direction). The dopant of the second conductivity type is, for example, boron (B), indium (In), or the like. A region into which the dopant has been implanted in step S1010 is a region which becomes the contact region 15 by the annealing in following step S1014.

In step S1012, the dopant of the first conductivity type is implanted from the upper surface 21 by a predetermined implantation amount, in the depth direction of the semiconductor substrate 10, between adjacent two of the trench portions in the arrangement direction (the X axis direction). The dopant of the first conductivity type is, for example, arsenic (As), phosphorus (P), antimony (Sb), or the like. A region into which the dopant has been implanted in step S1012 is a region which becomes the emitter region 12 by the annealing in following step S1014. The emitter region 12 is disposed in alignment with the contact region 15 in the extension direction (the Y axis direction).

In step S1014, the semiconductor substrate 10 into which the dopant has been implanted in the steps from step S1007 to step S1012 is annealed. By the annealing, the base region and the contact region 15 of the second conductivity type, and the accumulation region 16 and the emitter region 12 of the first conductivity type are formed.

In step S1016, the interlayer dielectric film 38 is formed on the upper surface 21. The interlayer dielectric film 38 may be formed on the active region in the semiconductor device 100 and the semiconductor device 200.

In step S1020, the contact hole 54 is formed in the interlayer dielectric film 38. By step S1020, the contact hole 54 is formed above the emitter region 12 and the contact region 15.

In subsequent step S1022, the dopant of the second conductivity type may be implanted from the upper surface 21 by a second depth and a second implantation amount, in the depth direction of the semiconductor substrate 10, through the contact hole 54. The second depth is shallower than the first depth. The dopant of the second conductivity type is, for example, boron (B), indium (In), or the like.

In step S1026, a barrier metal is formed on an upper surface of the interlayer dielectric film 38, and a side surface of the interlayer dielectric film 38 and the upper surface 21 which are in the contact hole 54. The barrier metal is, for example, titanium (Ti), or titanium nitride (TiN). The barrier metal suppresses a diffusion of the contact plug, which is to be formed in following step S1028, into the semiconductor substrate 10. In subsequent step S1028, the barrier metal is annealed.

In step S1030, the contact plug is formed in the contact hole 54 in which the barrier metal has been formed. The contact plug is tungsten (W) as an example.

Figure 23:
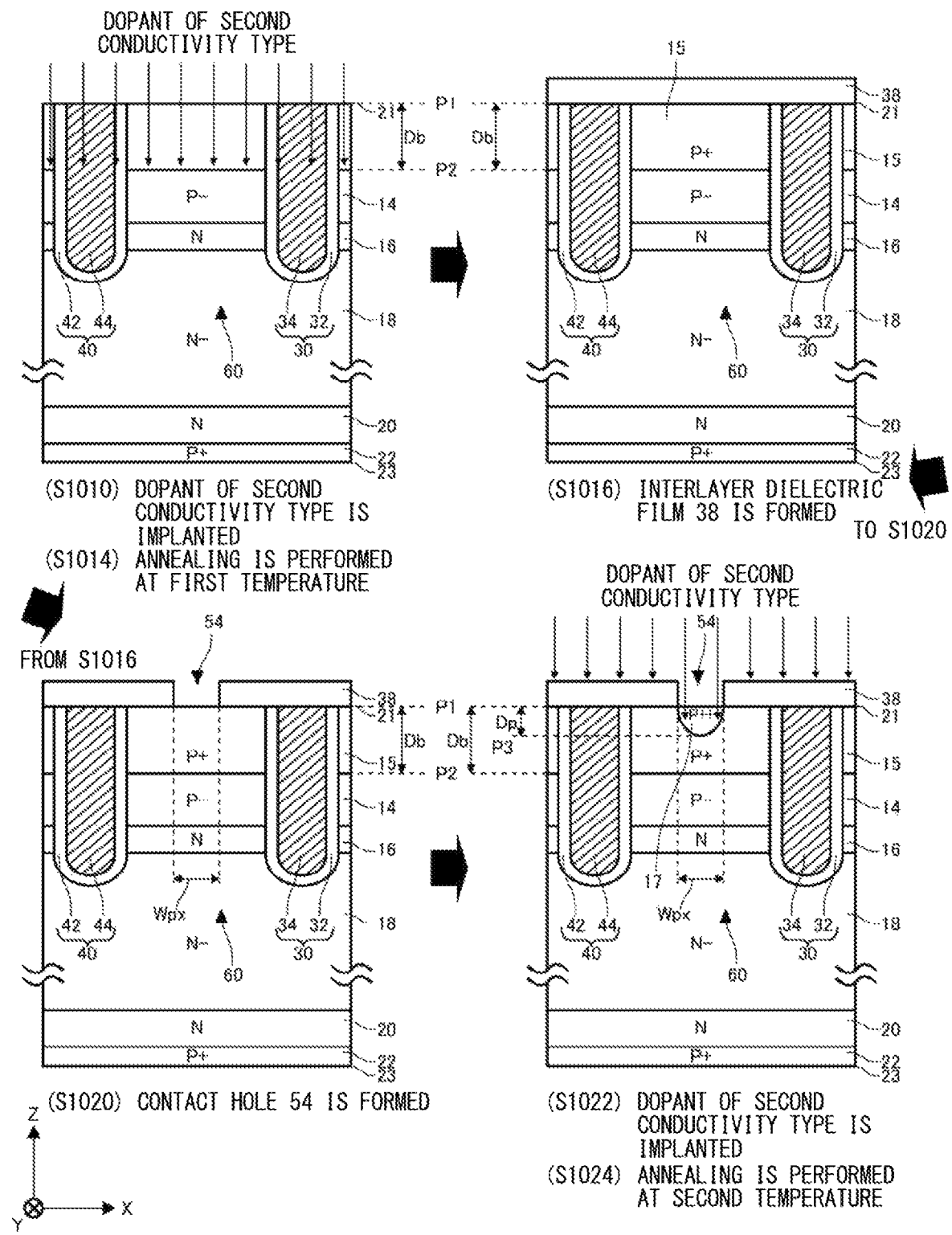
FIG. 23 is a diagram showing an example of the method of manufacturing a semiconductor device according to an embodiment of the invention.

FIG. 23 is a diagram showing an example of the method of manufacturing a semiconductor device according to an embodiment of the invention. FIG. 23 shows steps S1010, step S1014, step S1016, step S1020, step S1022, and step S1024 in FIG. 22, in detail.

In step S1010, the dopant of the second conductivity type is implanted from the upper surface 21 by the first depth Db and the first implantation amount, in the depth direction of the semiconductor substrate 10. An acceleration voltage of the dopant in step S1010 may be 100 keV or more and 140 keV or less. The implantation amount of the dopant may be $1\times10^{15}$ (/cm$^2$) or more and $5\times10^{15}$ (/cm$^2$) or less.

In step S1014, the semiconductor substrate 10 into which the dopant of the first conductivity type and the dopant of the second conductivity type have been implanted is annealed at a first temperature. The first temperature may be 950° C. or more and 1100° C. or less. An annealing time may be 20 minutes or more and 40 minutes or less. The annealing may be carried out in a nitrogen (N$_2$) atmosphere. By the annealing, the contact region 15 of the second conductivity type and the emitter region 12 of the first conductivity type are formed.

In step S1016, the interlayer dielectric film 38 is formed on the upper surface 21. The interlayer dielectric film 38 may be formed on the active region in the semiconductor device 100 and the semiconductor device 200.

In step S1020, the contact hole 54 is formed in the interlayer dielectric film 38. In step S1020, the upper surface 21 is exposed at a position where the contact hole 54 is formed in the XY plane. In subsequent step S1022, the dopant of the second conductivity type is implanted from the upper surface 21 by the second depth Dp and the second implantation amount, with the interlayer dielectric film 38 as a mask, through the contact hole 54.

The acceleration voltage of the dopant in step S1022 is lower than the acceleration voltage in step S1010. The acceleration voltage of the dopant in step S1022 may be 20 keV or more and 80 keV or less. Further, the second implantation amount in step S1022 is greater than or equal to the first implantation amount in step S1010. Specifically, the second implantation amount in step S1022 may be $1\times10^{15}$ (/cm$^2$) or more and $5\times10^{15}$ (/cm$^2$) or less. For example, even when the first implantation amount is set to be as high as $5\times10^{15}$ (/cm$^2$), a good characteristic of the plug region 17 cannot be obtained unless the second implantation amount is set to be higher than $5\times10^{15}$ (/cm$^2$). In other words, in a case of forming the plug region 17 on a front surface of the semiconductor substrate 10, in order to enhance the RBSOA tolerance, rather than increasing the impurity concentration of the contact region 15, the plug region 17 being different from the contact region 15, when the second implantation amount is less than the first implantation amount, an effect of the plug region 17 may not be sufficiently exhibited, the plug region 17 being different from the contact region 15.

Subsequently, in step S1024, the semiconductor substrate 10 into which the dopant of the second conductivity type has been implanted in step S1022 is annealed at a second temperature. The second temperature is lower than the first temperature in step S1014. The second temperature may be 800° C. or more and 900° C. or less. The annealing time may be very short, and may be one tenth or less in comparison with the annealing in step S1014. Specifically, the annealing time may be 5 seconds or more and one minute or less. The annealing may be carried out in a nitrogen (N$_2$) atmosphere. By the annealing, the plug region 17 of the second conductivity type is formed.

Further, in step S1012, the dopant of the first conductivity type is implanted from the upper surface 21 in the predetermined implantation amount. The acceleration voltage of the dopant in step S1012 may be lower than the acceleration voltage of the dopant in step S1010. By making the acceleration voltage of the dopant in step S1012 lower than the acceleration voltage of the dopant in step S1010, the dopant of the first conductivity type in step S1012 is implanted from the upper surface 21 to a shallower position than the dopant of the second conductivity type implanted in step S1010.

Further, in step S1018, flow processing is performed by annealing the interlayer dielectric film 38. An annealing temperature of the flow processing may be 940° C. or more and 1000° C. or less. The annealing time of the flow processing may be 5 minutes or more and 45 minutes or less. The annealing may be carried out in a nitrogen (N$_2$) atmosphere.

Figure 24:
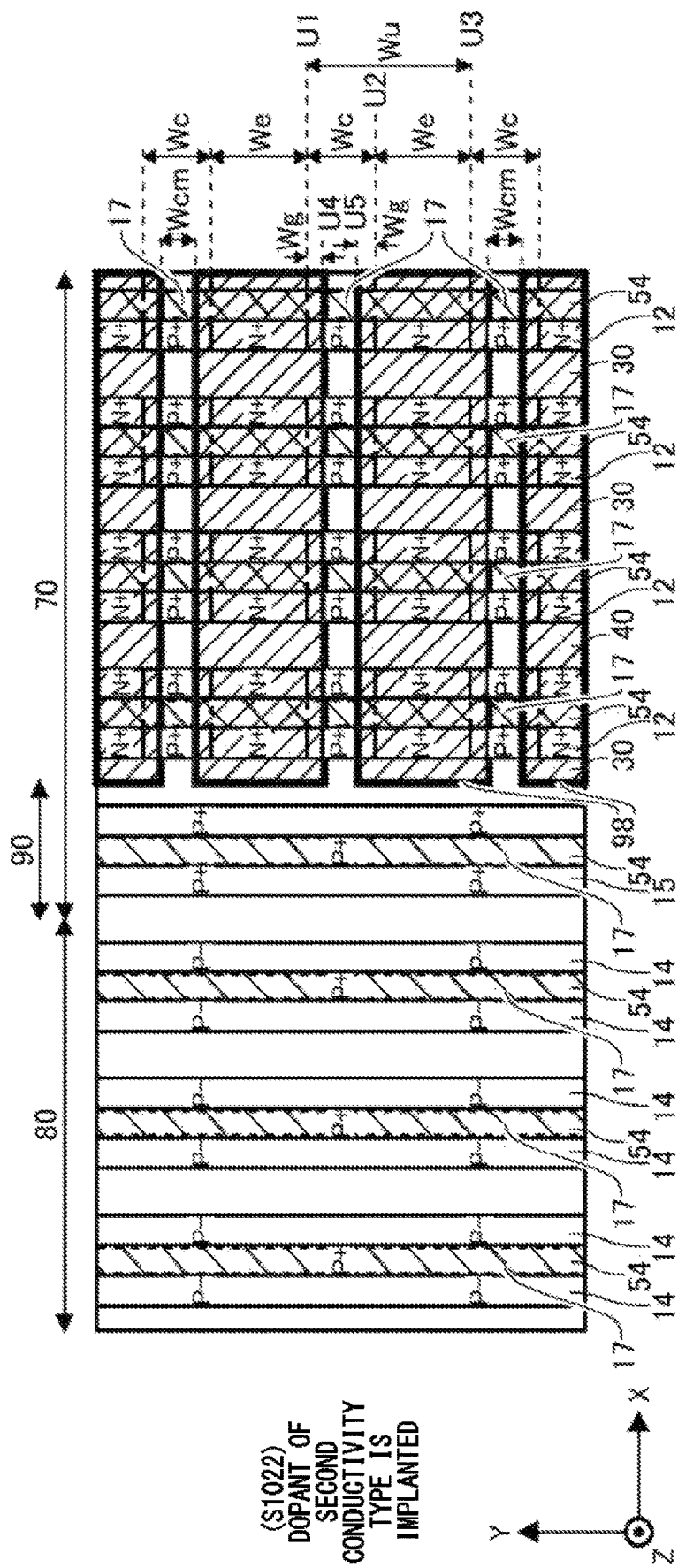
FIG. 24 is a conceptual view showing an example of a mask used at the time of a dopant implantation in step S1022 in FIG. 22.

FIG. 24 is a conceptual view showing an example of a mask used at the time of a dopant implantation in step S1022 in FIG. 22. The conceptual view shows a positional relationship between the region E in FIG. 18 and the mask in the top plan view. In step S1022, a region where the mask is disposed is set to be a hatched portion in the top plan view.

In step S1022, a mask 98 is disposed above the upper surface 21. In the transistor portion 70 excluding the boundary portion 90, the mask 98 is disposed to overlap the end portion of the contact region 15 in the extension direction. Specifically, the mask 98 is disposed to overlap the end portion of the contact region 15 by a length Wg from the position U1 to the position U4, and from the position U2 to the position U5. In the transistor portion 70 excluding the boundary portion 90, the position U4 is an end of the mask 98 on the negative side of the Y axis above the region into which the dopant of the second conductivity type is implanted. Further, the position U5 is an end of the mask 98 on the positive side of the Y axis above the region into which the dopant of the second conductivity type is implanted.

Note that a length of an opening of the mask 98 in the extension direction is represented by a length Wcm. The length Wg may be not less than 0.1 times and not more than 0.4 times the length Wc. The length Wg may be 0.1 μm or more and 0.6 μm or less. The length Wg is set to be smaller than the opening width of the contact hole 54 between the trench portions. The length Wcm may be not less than 0.3 times and not more than 0.7 times the length Wc. The length Wcm may be 0.4 μm or more and 0.8 μm or less.

Using the mask 98, the dopant of the second conductivity type is implanted by the second implantation amount. The position of the mask 98 of the transistor portion 70 in the top plan view may be the same as the position of the mask of the transistor portion 70 in step S1010 in the top plan view. In step S1020, the contact hole 54 is formed in the interlayer dielectric film 38. Therefore, in step S1022, the interlayer dielectric film 38 and the contact holes 54 are disposed above the upper surface 21. In FIG. 24, an illustration of the interlayer dielectric film 38 is omitted.

In step S1022, the interlayer dielectric film 38 is provided above the upper surface 21, and thus even in a region where the mask 98 is not disposed, a region other than the contact hole 54 is not exposed on the upper surface 21. Therefore, the dopant of the second conductivity type is implanted into the second position shallower than the first depth through the contact hole 54. The region into which the dopant of the second conductivity type has been implanted in step S1022 is annealed in following step S1024 to form the plug region 17.

With the above configuration, the length Wg is set to be smaller than the opening width of the contact hole 54 between the trench portions. Therefore, when the implanted dopant of the second conductivity type is diffused by the annealing, the plug region 17 formed of the dopant of the second conductivity type comes into contact with the emitter region 12, and it is possible to suppress a possibility of the plug region 17 coming into contact with the trench portion. Therefore, it is possible to suppress an unintentional increase of the gate threshold voltage Vth due to the contact of the plug region 17 with the trench portion.

While the embodiments of the present invention have been described, the technical scope of the invention is not limited to the scope of the above described embodiments. It is apparent to persons skilled in the art that various alterations and improvements can be added to the above-described embodiments. It is also apparent from the description of the scope of the claims that the embodiments added with such alterations or improvements can be included in the technical scope of the invention.

The operations, procedures, steps, and stages of each process performed by an apparatus, system, program, and method shown in the claims, specification, or diagrams can be performed in any order as long as the order is not indicated by "prior to," "before," or the like and as long as the output from a previous process is not used in a later process. Even if the process flow is described using phrases such as "first" or "next" in the claims, specification, or diagrams, it does not necessarily mean that the process must be performed in this order.

EXPLANATION OF REFERENCES

10: semiconductor substrate,
11: well region,
12: emitter region,
13: cell,
14: base region,
15: contact region,
16: accumulation region,
17: plug region,
18: drift region,
20: buffer region,
21: upper surface,
22: collector region,
23: lower surface,
24: collector electrode,
25: connection portion,
29: extension portion,
30: dummy trench portion,
31: edge portion,
32: dummy insulation film,
34: dummy conductive portion,
38: interlayer dielectric film,
39: extension portion,
40: gate trench portion,
41: edge portion,
42: gate insulation film,
44: gate conductive portion,
46: first gate runner,
48: gate runner,
49: contact hole,
50: gate metal layer,
51: second gate runner,
52: emitter electrode,
54: contact hole,
56: contact hole,
60: mesa portion,
62: mesa portion,
64: mesa portion,
70: transistor portion,
80: diode portion,
82: cathode region,
90: boundary portion,
92: edge termination structure portion,
98: mask,
100: semiconductor device,
110: temperature sense portion,
112: temperature sense wiring,
114: sense pad,
115: emitter pad,
116: gate pad,
117: cathode pad,
118: anode pad,
119: sense semiconductor element portion,
120: active region,
121: main semiconductor element portion,
140: outer peripheral end,
142: edge side,
150: semiconductor device,
200: semiconductor device,
300: semiconductor device

What is claimed is:

1. A method of manufacturing a semiconductor device comprising:
   forming a cell having a plurality of trench portions, a contact region of a second conductivity type, and an emitter region of a first conductivity type,
   each of the trench portions being provided, from an upper surface of a semiconductor substrate to an inside of the semiconductor substrate, to extend in a predetermined extension direction on the upper surface of the semiconductor substrate, the contact region being formed, in a depth direction of the semiconductor substrate between adjacent two of the trench portions, by implanting a dopant of the second conductivity type by a first depth and a first implantation amount, and the emitter region being disposed, in alignment with the contact region in the extension direction between the adjacent two of the trench portions, to be exposed on the upper surface of the semiconductor substrate, the cell having a length, in the extension direction, which is smaller than or equal to a width between the adjacent two of the trench portions, the emitter region, in the cell, having a length, in the extension direction, which is greater than a length of the contact region;

forming a contact hole above the cell, the contact hole having an opening width, between the trench portions, which is smaller than the length of the contact region in the extension direction; and forming a plug region of the second conductivity type by implanting the dopant of the second conductivity type by a second depth and a second implantation amount, in the depth direction of the semiconductor substrate, the second depth being shallower than the first depth, the second implantation amount being greater than or equal to the first implantation amount.

2. The method of manufacturing a semiconductor device according to claim 1, wherein the cell is formed such that the length of the cell is 3.2 μm or less in the extension direction.

3. The method of manufacturing a semiconductor device according to claim 1, wherein the contact hole is formed such that the opening width of the contact hole between the trench portions is 1.0 μm or less.

4. The method of manufacturing a semiconductor device according to claim 1, wherein the contact hole and the trench portions are formed such that the opening width of the contact hole between the trench portions is smaller than a width of each of the trench portions.

5. The method of manufacturing a semiconductor device according to claim 1, wherein the contact hole is formed such that the opening width of the contact hole between the trench portions is greater than the second depth.

6. The method of manufacturing a semiconductor device according to claim 1, wherein the contact hole and the plug region are formed such that the opening width of the contact hole between the trench portions is smaller than a width of the plug region between the trench portions.

7. The method of manufacturing a semiconductor device according to claim 1, wherein the plug region and the contact region are formed such that a peak position of a doping concentration of the plug region in the depth direction of the semiconductor substrate is shallower than half a depth from the upper surface of the semiconductor substrate to a peak position of a doping concentration of the contact region.

8. The method of manufacturing a semiconductor device according to claim 1, wherein the plug region is formed by causing a mask to overlap an end portion of the contact region in the extension direction, and implanting the dopant, and the contact hole is formed such that a length at which the mask overlaps the end portion of the contact region is smaller than the opening width of the contact hole between the trench portions.

9. The method of manufacturing a semiconductor device according to claim 1, wherein the contact region is annealed at a first temperature for a first period of time, and the plug region is annealed at a second temperature for a second period of time, the second temperature being lower than the first temperature, the second period of time being shorter than the first period of time.

10. The method of manufacturing a semiconductor device according to claim 1, further comprising:

forming, on the semiconductor substrate, a diode portion including the plug region, the plug region being formed by implanting the dopant of the second conductivity type by the second depth and the second implantation amount rather than by implanting the dopant of the second conductivity type by the first depth and the first implantation amount.

11. The method of manufacturing a semiconductor device according to claim 1, further comprising:

forming a sense semiconductor element portion on the semiconductor substrate by forming a main semiconductor element portion including the cell, and forming a current detection cell in the same step as the cell.

12. A semiconductor device comprising:

a semiconductor substrate;

trench portions, each of which is provided from an upper surface of the semiconductor substrate to an inside of the semiconductor substrate, and is provided to extend in a predetermined extension direction on the upper surface of the semiconductor substrate;

a base region of a second conductivity type which is provided to be shallower than each of the trench portions inside the semiconductor substrate;

a contact region of the second conductivity type which is provided above the base region inside the semiconductor substrate;

an emitter region which is provided in alignment with the contact region above the base region inside the semiconductor substrate;

a plug region of the second conductivity type which is provided to be shallower than a depth of the contact region inside the semiconductor substrate, and has a higher doping concentration than that of the contact region; and a contact hole which is provided above the contact region and the emitter region, and of which an opening width between the trench portions is smaller than a length of the contact region in the extension direction, wherein a cell formed by the contact region and the emitter region has a length, in the extension direction, which is smaller than or equal to a width between adjacent two of the trench portions, and the emitter region has a length, in the extension direction, which is greater than the length of the contact region, and a first integrated concentration obtained by integrating the doping concentration of the plug region in a depth direction of the semiconductor substrate is higher than or equal to a second integrated concentration obtained by integrating the doping concentration of the contact region in the depth direction of the semiconductor substrate.

* * * * *